United States Patent
Chamberlain et al.

(10) Patent No.: US 11,294,409 B2
(45) Date of Patent: *Apr. 5, 2022

(54) METHODS AND EQUIPMENT FOR REDUCING POWER LOSS IN CELLULAR SYSTEMS

(71) Applicant: CommScope Technologies LLC, Hickory, NC (US)

(72) Inventors: John C. Chamberlain, Hickory, NC (US); Michael Guerin, St. Charles, IL (US); Erik William Lilieholm, Richardson, TX (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/403,773

(22) Filed: May 6, 2019

(65) Prior Publication Data

US 2019/0258280 A1 Aug. 22, 2019

Related U.S. Application Data

(63) Continuation of application No. 14/701,904, filed on May 1, 2015, now Pat. No. 10,281,939, which is a
(Continued)

(51) Int. Cl.
*G05F 1/46* (2006.01)
*G01R 27/16* (2006.01)
(Continued)

(52) U.S. Cl.
CPC ........... *G05F 1/46* (2013.01); *G01R 19/2513* (2013.01); *G01R 27/16* (2013.01); *H02H 9/045* (2013.01);
(Continued)

(58) Field of Classification Search
CPC ......... G01R 27/16; H02H 9/045; H02H 9/041
See application file for complete search history.

(56) References Cited

U.S. PATENT DOCUMENTS 3,659,189 A 4/1972 Kiviranna
4,745,562 A 5/1988 Prazdny
(Continued)

FOREIGN PATENT DOCUMENTS

CA 2836133 11/2012
CN 101043239 A 9/2007
(Continued)

OTHER PUBLICATIONS

Chinese Office Action corresponding to Chinese Patent Application No. 201680006621.8, dated Mar. 4, 2019.
(Continued)

*Primary Examiner* — Alvaro E Fortich
*Assistant Examiner* — Zannatul Ferdous
(74) *Attorney, Agent, or Firm* — Fogg & Powers LLC

(57) ABSTRACT

Methods of powering a radio that is mounted on a tower of a cellular base station are provided in which a direct current ("DC") power signal is provided to the radio over a power cable and a voltage level of the output of the power supply is adjusted so as to provide a substantially constant voltage at a first end of the power cable that is remote from the power supply. Related cellular base stations and programmable power supplies are also provided.

26 Claims, 7 Drawing Sheets

Related U.S. Application Data continuation-in-part of application No. 14/321,897, filed on Jul. 2, 2014, now Pat. No. 9,448,576.

(60) Provisional application No. 61/940,631, filed on Feb. 17, 2014.

(51) Int. Cl.
  *H04W 4/80* (2018.01)
  *G01R 19/25* (2006.01)
  *H02H 9/04* (2006.01)
  *H04W 88/08* (2009.01)

(52) U.S. Cl.
  CPC ............ *H04W 4/80* (2018.02); *H02H 9/041* (2013.01); *H04W 88/08* (2013.01); *Y02D 30/70* (2020.08)

(56) References Cited

U.S. PATENT DOCUMENTS

| | | | |
|---|---|---|---|
| 5,073,977 | A | 12/1991 | Kawahata |
| 5,548,813 | A | 8/1996 | Charas et al. |
| 5,610,793 | A | 3/1997 | Luu |
| 6,095,867 | A | 8/2000 | Brandt et al. |
| 6,125,048 | A * | 9/2000 | Loughran ............... H02J 1/06 323/206 |
| 6,188,566 | B1 | 2/2001 | Aoyama |
| 6,640,111 | B1 | 10/2003 | Shapira |
| 6,813,510 | B1 | 11/2004 | Kunzinger |
| 7,027,290 | B1 | 4/2006 | Thrap |
| 7,460,381 | B2 | 12/2008 | Lanni |
| 7,508,687 | B2 | 3/2009 | Manolescu |
| 7,739,522 | B2 | 6/2010 | Festoe et al. |
| RE41,655 | E | 9/2010 | Woodhead et al. |
| 7,894,782 | B2 | 2/2011 | Rofougaran |
| 7,949,315 | B2 | 5/2011 | Rofougaran |
| 8,090,379 | B2 | 1/2012 | Lambert et al. |
| 8,311,591 | B2 | 11/2012 | Whittam et al. |
| 8,401,497 | B2 | 3/2013 | Rofougaran |
| 8,401,501 | B2 | 3/2013 | Rofougaran |
| 8,412,385 | B2 | 4/2013 | Brumett et al. |
| 8,520,549 | B2 | 8/2013 | Rofougaran |
| 8,521,100 | B2 | 8/2013 | Rofougaran |
| 8,526,893 | B2 | 9/2013 | Rofougaran |
| 8,547,164 | B2 | 10/2013 | Flores et al. |
| 8,566,627 | B2 | 10/2013 | Halepete et al. |
| 8,577,359 | B2 | 11/2013 | Wesby |
| 8,600,318 | B2 | 12/2013 | Rofougaran |
| 8,754,622 | B2 | 6/2014 | Dobkin et al. |
| 8,848,766 | B2 | 9/2014 | Lemson et al. |
| 8,855,586 | B2 | 10/2014 | Kenington |
| 9,099,860 | B2 | 8/2015 | Martinez et al. |
| 9,374,179 | B2 | 6/2016 | Wigren |
| 9,377,794 | B1 | 6/2016 | Dwelley et al. |
| 9,425,614 | B2 | 8/2016 | Xiong et al. |
| 9,448,576 | B2 | 9/2016 | Chamberlain et al. |
| 9,488,997 | B1 | 11/2016 | Dwelley et al. |
| 9,510,208 | B2 | 11/2016 | Wei et al. |
| 9,964,722 | B2 | 5/2018 | Chamberlain et al. |
| 10,025,335 | B2 | 7/2018 | Chamberlain et al. |
| 10,394,265 | B2 | 8/2019 | Chamberlain et al. |
| 10,423,180 | B2 | 9/2019 | Chamberlain et al. |
| 10,782,720 | B2 | 9/2020 | Guerin et al. |
| 2001/0025349 | A1 | 9/2001 | Sharood et al. |
| 2003/0085621 | A1 | 5/2003 | Potega |
| 2004/0121807 | A1 | 6/2004 | Delbreil et al. |
| 2004/0223346 | A1 | 11/2004 | Rayner et al. |
| 2004/0251968 | A1 | 12/2004 | Bar-David et al. |
| 2005/0242882 | A1 | 11/2005 | Anderson |
| 2005/0281063 | A1 | 12/2005 | Sointula |
| 2006/0005055 | A1 | 1/2006 | Potega |
| 2006/0077046 | A1 | 4/2006 | Endo |
| 2006/0164108 | A1 | 7/2006 | Herbold |
| 2006/0216837 | A1 | 9/2006 | Hachisuka et al. |
| 2007/0024372 | A1 | 2/2007 | Hagen |
| 2007/0093204 | A1 | 4/2007 | Kincard |
| 2007/0263675 | A1 | 11/2007 | Lum et al. |
| 2008/0010474 | A1 | 1/2008 | Chapuis |
| 2008/0030078 | A1 | 2/2008 | Whitted et al. |
| 2008/0172564 | A1 | 7/2008 | Diab et al. |
| 2008/0272654 | A1 | 11/2008 | Lontka |
| 2008/0300003 | A1 | 12/2008 | Jeck et al. |
| 2009/0215492 | A1 | 8/2009 | Pistner et al. |
| 2009/0258652 | A1 | 10/2009 | Lambert et al. |
| 2009/0289637 | A1 | 11/2009 | Radtke |
| 2010/0181840 | A1 | 7/2010 | Coulson et al. |
| 2010/0237948 | A1 | 9/2010 | Nguyen et al. |
| 2010/0290787 | A1 * | 11/2010 | Cox ............... H04B 10/25753 398/115 |
| 2011/0053632 | A1 | 3/2011 | Liu |
| 2011/0101937 | A1 | 5/2011 | Dobkin et al. |
| 2011/0159877 | A1 | 6/2011 | Kenington et al. |
| 2011/0237299 | A1 | 9/2011 | Boss et al. |
| 2012/0069882 | A1 | 3/2012 | Nino et al. |
| 2012/0155120 | A1 | 6/2012 | Sugawara |
| 2012/0181878 | A1 | 7/2012 | Nosaka et al. |
| 2012/0223575 | A1 | 9/2012 | Hachiya et al. |
| 2012/0235636 | A1 | 9/2012 | Partovi |
| 2012/0269509 | A1 | 10/2012 | Hultermans |
| 2012/0295670 | A1 | 11/2012 | Rofougaran |
| 2012/0317426 | A1 | 12/2012 | Hunter, Jr. et al. |
| 2013/0034949 | A1 | 2/2013 | Kao |
| 2013/0051440 | A1 * | 2/2013 | Rofougaran ............ H04B 1/16 375/219 |
| 2013/0082667 | A1 | 4/2013 | Sinreich |
| 2013/0108227 | A1 | 5/2013 | Conner |
| 2013/0215804 | A1 | 8/2013 | Lu et al. |
| 2013/0260702 | A1 | 10/2013 | Kenington |
| 2013/0314069 | A1 | 11/2013 | Suzuki |
| 2013/0328539 | A1 | 12/2013 | King et al. |
| 2013/0342949 | A1 | 12/2013 | Xiong et al. |
| 2014/0055898 | A1 | 2/2014 | Kostakis et al. |
| 2014/0132169 | A1 | 5/2014 | Boeke |
| 2014/0132192 | A1 * | 5/2014 | Hernandez Marti ....................... E21B 41/0085 318/479 |
| 2014/0159506 | A1 | 6/2014 | Kim et al. |
| 2014/0168842 | A1 | 6/2014 | Martinez et al. |
| 2014/0204496 | A1 | 7/2014 | Martinez Sanchez et al. |
| 2014/0204497 | A1 | 7/2014 | Martinez et al. |
| 2014/0372258 | A1 | 12/2014 | Elberbaum |
| 2015/0006095 | A1 | 1/2015 | Voisine |
| 2015/0015078 | A1 | 1/2015 | Kim |
| 2015/0058652 | A1 | 2/2015 | Dawley et al. |
| 2015/0080055 | A1 | 3/2015 | Smentek et al. |
| 2015/0089253 | A1 | 3/2015 | Doering et al. |
| 2015/0090487 | A1 | 4/2015 | Efraimsson |
| 2015/0097518 | A1 | 4/2015 | Bishop et al. |
| 2015/0137987 | A1 * | 5/2015 | Donderici ............... E21B 47/12 340/856.4 |
| 2015/0155669 | A1 * | 6/2015 | Chamberlain ....... G02B 6/4284 455/561 |
| 2015/0168974 | A1 | 6/2015 | Mascarenhas et al. |
| 2015/0234399 | A1 | 8/2015 | Chamberlain et al. |
| 2015/0234405 | A1 | 8/2015 | Chamberlain et al. |
| 2015/0256062 | A1 | 9/2015 | Shirahata et al. |
| 2015/0326317 | A1 * | 11/2015 | Michaelis .......... H04B 10/2589 398/115 |
| 2015/0382293 | A1 | 12/2015 | Heidler et al. |
| 2016/0191164 | A1 * | 6/2016 | Kim ................. H04B 10/25759 398/115 |
| 2016/0342168 | A1 | 11/2016 | Chamberlain et al. |
| 2017/0168513 | A1 | 6/2017 | Chamberlain et al. |
| 2017/0179817 | A1 | 6/2017 | Gu |
| 2018/0164355 | A1 | 6/2018 | Winkler et al. |
| 2018/0173263 | A1 | 6/2018 | Chamberlain et al. |
| 2018/0213091 | A1 | 7/2018 | Kostakis et al. |
| 2018/0270750 | A1 | 9/2018 | Coleman et al. |
| 2019/0064863 | A1 | 2/2019 | Guerin et al. |
| 2019/0235552 | A1 | 8/2019 | Guerin et al. |
| 2019/0235553 | A1 | 8/2019 | Guerin et al. |
| 2019/0391192 | A1 | 12/2019 | Winkler et al. |

(56) References Cited

U.S. PATENT DOCUMENTS

| | | | |
|---|---|---|---|
| 2019/0394723 | A1 | 12/2019 | Coleman et al. |
| 2020/0348708 | A1 | 11/2020 | Guerin et al. |
| 2020/0348709 | A1 | 11/2020 | Guerin et al. |
| 2021/0072779 | A1 | 3/2021 | Guerin et al. |

FOREIGN PATENT DOCUMENTS

| | | |
|---|---|---|
| CN | 201075824 | 6/2008 |
| CN | 101848004 | 9/2010 |
| CN | 201789332 U | 4/2011 |
| CN | 102439835 A | 5/2012 |
| CN | 102680799 A | 9/2012 |
| CN | 102752885 A | 10/2012 |
| CN | 104067443 A | 9/2014 |
| CN | 104335294 | 2/2015 |
| JP | 6-163330 | 6/1994 |
| KR | 10-2010-0048227 | 5/2010 |
| KR | 10-2010-0069332 | 6/2010 |
| KR | 10-2011-0024543 | 3/2011 |
| WO | 0167598 A1 | 9/2001 |
| WO | 2012/083746 | 6/2012 |
| WO | WO 2012/159358 | 11/2012 |
| WO | 2013/147332 | 10/2013 |
| WO | 2015042023 | 3/2015 |

OTHER PUBLICATIONS

Extended Supplementary European Search Report, corresponding to European Application No. 16749587.8-1202, dated Aug. 30, 2018.
Notification Concerning Transmittal of International Preliminary Report on Patentability, for corresponding application PCT/US2016/022575, dated Nov. 16, 2017, 9 pgs.
Notification of Transmittal of the International Search Report and the Written Opinion of the International Searching Authority, or the Declaration, for corresponding application PCT/US2018/017276, dated May 28, 2018, 16 pages.
Office Action corresponding to Chinese Application No. 201480051376.3 dated Dec. 11, 2017, (English translation, 15 pages).
Office Action corresponding to Chinese Application No. 201580007901.6, dated Nov. 27, 2017.
GE Product Data Sheet, CP2000DC54-PE Compact Power Line DC/DC Converter, Aug. 20, 2013, www.ge.com/powerelectronics, 15 pages.
Keithley Product Sheet, Single-Channel Programmable DC Power Supplies, Series 2200, undated, www.keithley.com, 4 pages, Admitted Prior Art.
Jim Williams et al., "2-Wire Virtual Remote Sensing for Voltage Regulators—Clairvoyance Marries Remote Sensing," Linear Technology Brochure, Application Note 126, Oct. 2010, www.linear.com, pp. AN126-1-AN126-22.
International Search Report and Written Opinion Corresponding to International Application No. PCT/US2014/055800; dated Dec. 18, 2014; 14 Pages.
Notification of Transmittal of International Search Report and the Written Opinion of the International Searching Authority, or the Declaration Corresponding to International Application No. PCT/US2016/015085; dated May 12, 2016; 14 Pages.
International Search Report and Written Opinion corresponding to International Application No. PCT/US2014/055800; dated Sep. 17, 2015; 7 pages.
Notification Concerning Transmittal of International Preliminary Report on Patentability to corresponding Application No. PCT/2015/013740, dated Sep. 1, 2016, 14 pages.
Invitation to Pay Additional Fees and, Where Applicable, Protest Fees, PCT/US2016/022575, dated Jun. 23, 2016, 7 pages.
Notification of Transmittal of the International Search Report and the Written Opinion of the International Searching Authority, or the Declaration for corresponding Application No. PCT/US2016/022575, dated Aug. 17, 2016, 14 pages.
Extended European Search Report Corresponding to International Application No. EP 1574871.4-1875; dated Jul. 6, 2017; 7 pages.
Notification Concerning Transmittal of International Preliminary Report on Patentability Corresponding to International Application No. PCT/US2016/015085; dated Aug. 24, 2017; 10 Pages.
European Office Action corresponding to European Patent Application No. 15748741.4; dated Jun. 27, 2019, 5 pages.
Australian Government IP Australia, "Notice of Acceptance from AU Application No. 2015217537 dated May 2, 2019", from Foreign Counterpart to U.S. Appl. No. 14/321,897, pp. 1-36, Published: AU.
Chamberlain et al., "Programmable Power Supplies for Cellular Base Stations and Related Methods of Reducing Power Loss in Cellular Systems", "U.S. Appl. No. 61/940,631", dated Feb. 17, 2014, pp. 1-24, Published in: US.
China National Intellectual Property Administration, "First Office Action from CN Application No. 201910478384.0", from Foreign Counterpart to U.S. Appl. No. 14/321,897, filed Mar. 24, 2020, pp. 1 through 6, Published: CN.
China National Intellectual Property Administration, "First Office Action from CN Application No. 202010226835.4", from Foreign Counterpart to U.S. Appl. No. 14/487,329, filed Oct. 19, 2020, pp. 1 through 12, Published: CN.
European Patent Office, "Communication pursuant to Article 94(3) EPC from EP Application No. 16749587.8", from Foreign Counterpart to U.S. Appl. No. 14/487,329, filed Sep. 16, 2020, pp. 1 through 4, Published: EP.
European Patent Office, "Communication under Rule 71(3) EPC from EP Application No. 14845872.2", from Foreign Counterpart to U.S. Appl. No. 14/487,329, filed Apr. 3, 2019, pp. 1 through 38, Published: EP.
European Patent Office, "Extended European Search Report from EP Application No. 16749587.8 dated Dec. 3, 2018", from Foreign Counterpart to PCT Application No. PCT/US2016/015085, dated Dec. 3, 2018, pp. 1-11, Published EP.
European Patent Office, "Partial Supplementary European Search Report for EP 14845872.2 dated Feb. 17, 2017", from Foreign Counterpart to U.S. Appl. No. 14/321,897, dated Feb. 17, 2017, pp. 1-7, Published in: EP.
International Bureau, "International Preliminary Report on Patentability from PCT Application No. PCT/US2016/022575", from Foreign Counterpart to U.S. Appl. No. 14/321,897, filed Nov. 7, 2017, pp. 1 through 8, Published: WO.
International Bureau, "International Preliminary Report on Patentability from PCT Application No. PCT/US2018/017276 dated Aug. 22, 2019", from Foreign Counterpart to U.S. Appl. No. 14/321,897, pp. 1-10, Published: WO.
International Preliminary Examining Authority, "International Preliminary Report on Patentability from PCT Application No. PCT/US2014/055800", from Foreign Counterpart to U.S. Appl. No. 14/487,329, filed Sep. 17, 2015, pp. 1 through 7, Published: WO.
International Searching Authority, "International Search Report and Written Opinion from PCT Application No. PCT/US2015/013740", from Foreign Counterpart to U.S. Appl. No. 14/321,897, dated Apr. 28, 2015, pp. 1-17, Published in: KR.
McGill et al., "High-Resolution Alignment of Sampled Waveforms," IEEE Transactions on Biomedical Engineering, vol. BME-31, No. 6, Jun. 1984, pp. 462-468.
State Intellectual Property P.R. China, "Text of the first Office Action from CN Application No. 201480051376.3", from Foreign Counterpart to U.S. Appl. No. Jan. 4, 2017, pp. 1 through 24, Published: CN.
U.S. Patent and Trademark Office, "Advisory Action", U.S. Appl. No. 15/497,021, dated Nov. 5, 18, pp. 1-7, Published: US.
U.S. Patent and Trademark Office, "Advisory Action", U.S. Appl. No. 15/898,573, filed Oct. 15, 2018, pp. 1 through 4, Published: US.
U.S. Patent and Trademark Office, "Advisory Action", U.S. Appl. No. 16/163,958, filed Jan. 16, 2020, pp. 1-9, Published: US.
U.S. Patent and Trademark Office, "Corrected Notice of Allowability" U.S. Appl. No. 14/487,329, dated Jan. 20, 16, pp. 1-2, Published: US.

(56) References Cited

OTHER PUBLICATIONS

U.S. Patent and Trademark Office, "Corrected Notice of Allowability", U.S. Appl. No. 14/321,897, filed Aug. 11, 2016, pp. 1-3, Published: US.
U.S. Patent and Trademark Office, "Corrected Notice of Allowability", U.S. Appl. No. 15/891,194, filed Jul. 30, 2020, pp. 1 through 10, Published: US.
U.S. Patent and Trademark Office, "Corrected Notice of Allowability", U.S. Appl. No. 15/891,194, filed Sep. 11, 2020, pp. 1 through 11, Published: US.
U.S. Patent and Trademark Office, "Final Office Action", U.S. Appl. No. 14/321,897, filed Mar. 23, 2016, pp. 1 through 26, Published: US.
U.S. Patent and Trademark Office, "Final Office Action", U.S. Appl. No. 14/619,211, filed Jun. 1, 2016, pp. 1 through 16, Published: US.
U.S. Patent and Trademark Office, "Final Office Action", U.S. Appl. No. 14/701,904, filed Sep. 7, 2017, pp. 1 through 22, Published: US.
U.S. Patent and Trademark Office, "Final Office Action", U.S. Appl. No. 15/226,977, filed Aug. 22, 2017, pp. 1 through 23, Published: US.
U.S. Patent and Trademark Office, "Final Office Action", U.S. Appl. No. 15/497,021, filed Jul. 16, 2018, pp. 1 through 28, Published: US.
U.S. Patent and Trademark Office, "Final Office Action", U.S. Appl. No. 15/898,573, filed Jun. 29, 2018, pp. 1 through 18, Published: US.
U.S. Patent and Trademark Office, "Final Office Action", U.S. Appl. No. 15/898,809, dated Nov. 20, 18, pp. 1-19, Published: US.
U.S. Patent and Trademark Office, "Final Office Action", U.S. Appl. No. 16/163,958, filed Nov. 13, 2019, pp. 1 through 38, Published: US.
U.S. Patent and Trademark Office, "Final Office Action", U.S. Appl. No. 16/380,921, filed Nov. 18, 2019, pp. 1 through 34, Published: US.
U.S. Patent and Trademark Office, "Notice of Allowability", U.S. Appl. No. 14/619,211, filed Aug. 7, 2017, pp. 1 through 2, Published: US.
U.S. Patent and Trademark Office, "Notice of Allowability", U.S. Appl. No. 15/226,977, filed Jun. 8, 2018, pp. 1 through 4, Published: US.
U.S. Patent and Trademark Office, "Notice of Allowability", U.S. Appl. No. 15/671,226, filed Jan. 9, 2018, pp. 1 through 4, Published: US.
U.S. Patent and Trademark Office, "Notice of Allowability", U.S. Appl. No. 15/891,194, filed Oct. 9, 2020, pp. 1 through 10, Published: US.
U.S. Patent and Trademark Office, "Notice of Allowance", U.S. Appl. No. 14/321,897, filed Jul. 28, 2016, pp. 1-10, Published: US.
U.S. Patent and Trademark Office, "Notice of Allowance", U.S. Appl. No. 14/487,329, filed Dec. 14, 2015, pp. 1 through 5, Published: US.
U.S. Patent and Trademark Office, "Notice of Allowance", U.S. Appl. No. 14/619,211, filed Apr. 20, 2017, pp. 1 through 5, Published: US.
U.S. Patent and Trademark Office, "Notice of Allowance", U.S. Appl. No. 14/619,211, filed Dec. 30, 2016, pp. 1 through 5, Published: US.
U.S. Patent and Trademark Office, "Notice of Allowance", U.S. Appl. No. 14/701,904, filed Oct. 10, 2018, pp. 1 through 15, Published: US.
U.S. Patent and Trademark Office, "Notice of Allowance", U.S. Appl. No. 14/701,904, filed Dec. 28, 2018, pp. 1 through 16, Published: US.
U.S. Patent and Trademark Office, "Notice of Allowance", U.S. Appl. No. 15/226,977, filed Apr. 6, 2018, pp. 1 through 14, Published: US.
U.S. Patent and Trademark Office, "Notice of Allowance", U.S. Appl. No. 15/226,977, filed May 25, 2018, pp. 1 through 10, Published: US.
U.S. Patent and Trademark Office, "Notice of Allowance", U.S. Appl. No. 15/497,021, filed Feb. 4, 2019, pp. 1 through 7, Published: US.
U.S. Patent and Trademark Office, "Notice of Allowance", U.S. Appl. No. 15/497,021, filed Mar. 14, 2019, pp. 1 through 14, Published: US.
U.S. Patent and Trademark Office, "Notice of Allowance", U.S. Appl. No. 15/671,226, filed Mar. 23, 2018, pp. 1 through 6, Published: US.
U.S. Patent and Trademark Office, "Notice of Allowance", U.S. Appl. No. 15/671,226, filed Dec. 15, 2017, pp. 1 through 16, Published: US.
U.S. Patent and Trademark Office, "Notice of Allowance", U.S. Appl. No. 15/891,194, filed Jan. 31, 2020, pp. 1-14, Published: US.
U.S. Patent and Trademark Office, "Notice of Allowance", U.S. Appl. No. 15/891,194, filed Oct. 3, 2019, pp. 1 through 11, Published: US.
U.S. Patent and Trademark Office, "Notice of Allowance", U.S. Appl. No. 15/898,573, filed Jan. 24, 2019, pp. 1 through 9, Published: US.
U.S. Patent and Trademark Office, "Notice of Allowance", U.S. Appl. No. 15/898,573, filed Mar. 21, 2019, pp. 1 through 17, Published: US.
Extended European Search Report corresponding to European Application No. 18747190.9 dated Dec. 11, 2020.
U.S. Patent and Trademark Office, "Notice of Allowance", U.S. Appl. No. 15/971,302, filed Feb. 1, 2019, pp. 1 through 8, Published: US.
U.S. Patent and Trademark Office, "Notice of Allowance", U.S. Appl. No. 15/971,302, filed Dec. 14, 2018, pp. 1 through 15, Published: US.
U.S. Patent and Trademark Office, "Notice of Allowance", U.S. Appl. No. 16/380,921, filed May 20, 2020, pp. 1 through 21, Published: US.
U.S. Patent and Trademark Office, "Notice of Allowance", U.S. Appl. No. 16/433,268, filed Feb. 25, 2020, pp. 1 through 8, Published: US.
U.S. Patent and Trademark Office, "Notice of Allowance", U.S. Appl. No. 16/433,268, filed Nov. 6, 2019, pp. 1 through 8, Published: US.
U.S. Patent and Trademark Office, "Notice of Allowance", U.S. Appl. No. 16/433,268, filed Dec. 11, 2019, pp. 1 through 8, Published: US.
U.S. Patent and Trademark Office, "Office Action", U.S. Appl. No. 14/321,897, filed Nov. 5, 2015, pp. 1-25, Published: US.
U.S. Patent and Trademark Office, "Office Action", U.S. Appl. No. 14/487,329, filed Aug. 12, 2015, pp. 1 through 12, Published: US.
U.S. Patent and Trademark Office, "Office Action", U.S. Appl. No. 14/619,211, filed Dec. 3, 2015, pp. 1 through 13, Published: US.
U.S. Patent and Trademark Office, "Office Action", U.S. Appl. No. 14/701,904, filed Feb. 8, 2018, pp. 1-22, Published: U.S.
U.S. Patent and Trademark Office, "Office Action", U.S. Appl. No. 14/701,904, filed Mar. 7, 2017, pp. 1-18, Published: US.
U.S. Patent and Trademark Office, "Office Action", U.S. Appl. No. 15/226,977, filed Mar. 20, 2017, pp. 1 through 35, Published: US.
U.S. Patent and Trademark Office, "Office Action", U.S. Appl. No. 15/497,021, filed Jan. 31, 2018, pp. 1 through 39, Published: US.
U.S. Patent and Trademark Office, "Office Action", U.S. Appl. No. 15/891,194, filed Jun. 24, 2019, pp. 1 through 62, Published: US.
U.S. Patent and Trademark Office, "Office Action", U.S. Appl. No. 15/898,573, filed Apr. 11, 2018, pp. 1 through 30, Published: US.
U.S. Patent and Trademark Office, "Office Action", U.S. Appl. No. 15/898,809, filed Jun. 15, 2020, pp. 1 through 12, Published: US.
U.S. Patent and Trademark Office, "Office Action", U.S. Appl. No. 15/898,809, dated Oct. 3, 2019, pp. 1-10, Published: US.
U.S. Patent and Trademark Office, "Office Action", U.S. Appl. No. 15/898,809, dated May 9, 2018, pp. 1-29, Published: US.
U.S. Patent and Trademark Office, "Office Action", U.S. Appl. No. 15/939,973, filed Nov. 14, 2018, pp. 1 through 19, Published: US.
U.S. Patent and Trademark Office, "Office Action", U.S. Appl. No. 16/163,958, filed Jan. 4, 2021, pp. 1 through 21, Published: US.
U.S. Patent and Trademark Office, "Office Action", U.S. Appl. No. 16/163,958, filed Jun. 25, 2019, pp. 1 through 78, Published: US.

(56) References Cited

OTHER PUBLICATIONS

U.S. Patent and Trademark Office, "Office Action", U.S. Appl. No. 16/163,958, filed Jun. 26, 2020, pp. 1 through 30, Published: US.

U.S. Patent and Trademark Office, "Office Action", U.S. Appl. No. 16/380,907, filed May 29, 2020, pp. 1 through 26, Published: US.

U.S. Patent and Trademark Office, "Office Action", U.S. Appl. No. 16/380,907, filed Nov. 18, 2019, pp. 1 through 65, Published: US.

U.S. Patent and Trademark Office, "Office Action", U.S. Appl. No. 16/380,921, filed Jun. 26, 2019, pp. 1 through 56, Published: US.

U.S. Patent and Trademark Office, "Office Action", U.S. Appl. No. 16/433,268, filed Jul. 17, 2019, pp. 1 through 24, Published: US.

U.S. Patent and Trademark Office, "Office Action", U.S. Appl. No. 16/863,339, filed Oct. 16, 2020, pp. 1 through 27, Published: US.

U.S. Patent and Trademark Office, "Office Action", U.S. Appl. No. 16/994,809, filed Nov. 19, 2020, pp. 1 through 23, Published: US.

U.S. Patent and Trademark Office, "Restriction Requirement", U.S. Appl. No. 15/891,194, filed Mar. 25, 2019, pp. 1 through 7, Published: US.

Australian Government IP Australia, "Examination report No. 2 for standard patent application from AU Application No. 2015217537", from Foreign Counterpart to U.S. Appl. No. 14/321,897, filed Jan. 24, 2019, pp. 1 through 4, Published: AU.

China National Intellectual Property Administration, "Second Office Action from CN Application No. 201910478384.0", from Foreign Counterpart to U.S. Appl. No. 14/321,897, filed Feb. 1, 2021, pp. 1 through 11, Published: CN.

European Patent Office, "Communication pursuant to Article 94(3) EPC from EP Application No. 15/748741.4", from Foreign Counterpart to U.S. Appl. No. 14/321,897, filed Feb. 16, 2021, pp. 1 through 4, Published: EP.

U.S. Patent and Trademark Office, "Final Office Action", U.S. Appl. No. 16/380,907, filed Feb. 5, 2021, pp. 1 through 38, Published: US.

U.S. Patent and Trademark Office, "Notice of Allowance", U.S. Appl. No. 15/898,809, filed Feb. 24, 2021, pp. 1 through 41, Published: US.

U.S. Patent and Trademark Office, "Advisory Action", U.S. Appl. No. 16/380,907, filed Apr. 13, 2021, pp. 1 through 21, Published: US.

U.S. Patent and Trademark Office, "Notice of Allowance", U.S. Appl. No. 15/898,809, filed Apr. 16, 2021, pp. 1 through 24, Published: US.

U.S. Patent and Trademark Office, "Notice of Allowance", U.S. Appl. No. 16/163,958, filed May 25, 2021, pp. 1 through 45, Published: US.

U.S. Patent and Trademark Office, "Final Office Action", U.S. Appl. No. 16/994,809, filed May 28, 2021, pp. 1 through 53, Published: US.

Australian Government IP Australia, "Notice of acceptance for patent application from AU Application No. 2019216666", from Foreign Counterpart to U.S. Appl. No. 14/321,897, filed Mar. 12, 2021, pp. 1 through 3, Published: AU.

European Patent Office, "Extended European Search Report from EP Application No. 21152068.9", from Foreign Counterpart to U.S. Appl. No. 14/321,897, filed Mar. 19, 2021, pp. 1 through 7, Published: EP.

China National Intellectual Property Administration, "Third Office Action from CN Application No. 201910478384.0", from Foreign Counterpart to U.S. Appl. No. 14/321,897, filed Jun. 18, 2021, pp. 1 through 7, Published: CN.

U.S. Patent and Trademark Office, "Notice of Allowance", U.S. Appl. No. 15/898,809, filed Jun. 30, 2021, pp. 1 through 18, Published: US.

U.S. Patent and Trademark Office, "Notice of Allowance" U.S. Appl. No. 15/898,809, dated Nov. 3, 2021 pp. 1 through 20, Published in U.S.

U.S. Patent and Trademark Office, "Office Action", U.S. Appl. No. 16/380,907, filed Nov. 5, 2021, pp. 1 through 54, Published: US.

U.S. Patent and Trademark Office, "Advisory Action", U.S. Appl. No. 16/994,809, filed Aug. 3, 2021, pp. 1 through 14, Published: US.

U.S. Patent and Trademark Office, "Notice of Allowance", U.S. Appl. No. 16/163,958, filed Aug. 11, 2021, pp. 1 through 13, Published: US.

U.S. Patent and Trademark Office, "Office Action", U.S. Appl. No. 16/480,818, filed Oct. 4, 2021, pp. 1 through 136, Published: US.

Australian Government IP Australia, "Examination report No. 1 for Standard Patent Application from AU Application No. 2020294297", from Foreign Counterpart to U.S. Appl. No. 16/163,958, filed Nov. 15, 2021, pp. 1 through 3, Published: AU.

\* cited by examiner

METHODS AND EQUIPMENT FOR REDUCING POWER LOSS IN CELLULAR SYSTEMS

CROSS-REFERENCE TO RELATED APPLICATIONS

The present application claims priority under 35 U.S.C. § 120 as a continuation of U.S. patent application Ser. No. 14/701,904, filed May 1, 2015, which is a continuation-in-part of U.S. patent application Ser. No. 14/321,897, filed Jul. 2, 2014, which in turn claims priority to U.S. Provisional Patent Application Ser. No. 61/940,631, filed Feb. 17, 2014, the entire contents of each of which is incorporated herein by reference as if set forth in its entirety.

FIELD OF THE INVENTION

The present invention relates generally to cellular communications systems and, more particularly, to cellular communications power supply systems.

BACKGROUND

Cellular base stations typically include, among other things, a radio, a baseband unit, and one or more antennas. The radio receives digital information and control signals from the baseband unit and modulates this information into a radio frequency ("RF") signal that is transmitted through the antennas. The radio also receives RF signals from the antenna and demodulates these signals and supplies them to the baseband unit. The baseband unit processes demodulated signals received from the radio into a format suitable for transmission over a backhaul communications system. The baseband unit also processes signals received from the backhaul communications system and supplies the processed signals to the radio. A power supply may also be provided that generates suitable direct current ("DC") power signals for powering the baseband unit and the radio. For example, the radio is often powered by a (nominal) 48 Volt DC power supply in cellular systems that are currently in use today. A battery backup is also typically provided to maintain service for a limited period of time during power outages.

In order to increase coverage and signal quality, the antennas in many cellular base stations are located at the top of an antenna tower, which may be, for example, about fifty to two hundred feet tall. Antennas are also routinely mounted on other elevated structures such as, for example, buildings, utility poles and the like. Until fairly recently, the power supply, baseband unit and radio were all located in an equipment enclosure at the bottom of the antenna tower or other elevated structure to provide easy access for maintenance, repair and/or later upgrades to the equipment. Coaxial cable(s) were routed from the equipment enclosure to the top of the antenna tower and were used to carry RF signals between the radios and the antennas.

FIG. 1 is a schematic diagram that illustrates a conventional cellular base station 10. As shown in FIG. 1, the depicted cellular base station 10 includes an equipment enclosure 20 and an antenna tower 30. The equipment enclosure 20 is typically located at the base of the antenna tower 30, as shown in FIG. 1. A baseband unit 22, a radio 24 and a power supply 26 are located within the equipment enclosure 20. The baseband unit 22 may be in communication with a backhaul communications system 44. A plurality of antennas 32 (e.g., three sectorized antennas 32-1, 32-2, 32-3) are located at the top of the antenna tower 30. Three coaxial cables 34 (which are bundled together in FIG. 1 to appear as a single cable) connect the radio 24 to the antennas 32. The antennas 32 are passive (unpowered) devices and hence none of the equipment at the top of the tower 30 requires electrical power. While the cellular base station 10 of FIG. 1 (and various other cellular base stations shown in subsequent figures) is shown as a having a single baseband unit 22 and radio 24 to simplify the drawings and description, it will be appreciated that cellular base stations routinely have multiple baseband units 22 and radios 24 (and additional antennas 32), with three, six, nine or even twelve baseband units 22 and radios 24 being common in state-of-the-art systems.

In recent years, a shift has occurred and the radio 24 is now more typically located at the top of the tower 30 in new or upgraded cellular installations. Radios that are located at the top of the tower 30 are typically referred to as remote radio heads ("RRH") 24'. Using remote radio heads 24' may significantly improve the quality of the cellular data signals that are transmitted and received by the cellular base station, as the use of remote radio heads 24' may reduce signal transmission losses and noise. In particular, as the coaxial cables 34 that connect radios 24 that are located at the base of an antenna tower 30 to antennas 32 that are mounted near the top of the antenna tower 30 may have lengths of 100-200 feet or more, the signal loss that occurs in transmitting signals at cellular frequencies (e.g., 1.8 GHz, 3.0 GHz, etc.) over these coaxial cables 34 may be significant, as at these frequencies the coaxial cables 34 tend to radiate RF signal energy. Because of this loss in signal power, the signal-to-noise ratio of the RF signals may be degraded in systems that locate the radio 24 at the bottom of the antenna tower 30 as compared to cellular base stations having remote radio heads 24' that are located at the top of the tower 30 next to the antennas 32 (note that signal losses in the cabling connection between the baseband unit 22 at the bottom of the tower 30 and the remote radio head 24' at the top of the tower 30 may be much smaller, as these signals are transmitted at baseband or intermediate frequencies as opposed to RF frequencies, and because these signals may be transmitted up the antenna tower 30 over fiber optic cables, which may exhibit lower losses).

FIG. 2 is a schematic diagram that illustrates a cellular base station 10' according to this newer architecture. As shown in FIG. 2, the baseband unit 22 and the power supply 26 may still be located at the bottom of the tower 30 in the equipment enclosure 20. The radio 24 in the form of an remote radio head 24' is located at the top of the tower 30 immediately adjacent to the antennas 32. While the use of tower-mounted remote radio heads 24' may improve signal quality, it also, unfortunately, requires that DC power be delivered to the top of the tower 30 to power the remote radio head 24'. As shown in FIG. 2, typically a fiber optic cable 38 connects the baseband unit 22 to the remote radio head 24' (as fiber optic links may provide greater bandwidth and lower loss transmissions), and a separate or combined ("composite") power cable 36 is provided for delivering the DC power signal to the remote radio head 24'. The separate power cable 36 is typically bundled with the fiber optic cable 38 so that they may be routed up the tower 30 together. In other cases (not shown), a hybrid fiber optic/power trunk cable 40 may be run up the tower 30. Such trunk cables 40 typically have junction enclosures on either end thereof, and a first set of data and power jumper cables are used to connect the junction enclosure on the ground end of the trunk cable 40 to the baseband unit(s) 22 and power supply 26, and a second set of data and power (or combined data/power) jumper cables are used to connect the junction enclosure at the top of the tower 30 to the remote radio heads 24.

Another change that has occurred in the cellular industry is a rapid increase in the number of subscribers as well as a dramatic increase in the amount of voice and data traffic transmitted and received by a typical subscriber. In response to this change, the number of remote radio heads 24' and antennas 32 that are being mounted on a typical antenna tower 30 has also increased, with twelve remote radio heads 24' and twelve or more antennas 32 being a common configuration today. Additionally, higher power remote radio heads 24' are also being used. These changes may result in increased weight and wind loading on the antenna towers 30 and the need for larger, more expensive trunk cables 40.

SUMMARY

Pursuant to embodiments of the present invention, methods of powering a radio that is mounted on a tower of a cellular base station (or other location remote from an associated baseband unit) are provided in which a DC power signal is output from a power supply and the DC power signal that is output from the power supply is supplied to the radio over a power cable. A voltage level of the DC power signal that is output from the power supply is adjusted so that the DC power signal at a radio end of the power cable that is remote from the power supply has a substantially constant voltage notwithstanding variation in a current level of the DC power signal.

In some embodiments, the power supply may be a programmable power supply, and the method may further include inputting information to the power supply from which the voltage level of the DC power signal that is output from the power supply can be computed that will provide the DC power signal at the radio end of the power cable that has the substantially constant voltage. In such embodiments, the information that is input to the power supply may be a resistance of the power cable, or may be a length of the power cable and a diameter of the conductive core of the power cable.

In some embodiments, a current level of the DC power signal that is output from the power supply may be measured, and the voltage level of the DC power signal that is output by the power supply may be automatically adjusted in response to changes in the measured output current of the DC power signal that is output from the power supply to provide the DC power signal at the radio end of the power cable that has the substantially constant voltage.

In some embodiments, the programmable power supply may be a DC-to-DC converter that receives a DC power signal that is output from a second power supply and adjusts a voltage level of the DC power signal that is output from the second power supply to provide the DC power signal at the radio end of the power cable that has the substantially constant voltage. The substantially constant voltage may be a voltage that exceeds a nominal power signal voltage of the radio and which is less than a maximum power signal voltage of the radio.

In some embodiments, a signal may be transmitted over the power cable that is used to determine an electrical resistance of the power cable. In some embodiments, the substantially constant voltage may be significantly higher than a maximum power signal voltage of the radio, and a tower-mounted DC-to-DC converter may be used to reduce a voltage of the power signal at the radio end of the power cable to a voltage that is less than the maximum power supply voltage of the radio.

Pursuant to further embodiments of the present invention, cellular base station systems are provided that include a tower with at least one antenna mounted thereon, an RRH mounted on the tower, a baseband unit that is in communication with the remote radio head, a programmable power supply located remotely from the remote radio head; and a power cable having a first end that receives a DC power signal from the programmable power supply and a second end that provides the DC power signal to the remote radio head. The programmable power supply is configured to provide a substantially constant voltage at the second end of the power cable by adjusting a voltage level of the DC power signal output by the programmable power supply based on the current level output by the programmable power supply and a resistance of the power cable.

In some embodiments, the programmable power supply may include a user interface that is configured to receive a resistance of the power cable and/or information regarding characteristics of the power cable from which the resistance of the power cable may be calculated. The programmable power supply may further include a current measurement module that measures a current output by the power supply. The programmable power supply may also include a feedback loop that adjusts the voltage level of the DC power signal output of the power supply based on the measured current output by the power supply.

Pursuant to still further embodiments of the present invention, programmable power supplies are provided that include an input; a conversion circuit that is configured to convert an input signal into a DC output signal that is output through an output port; a current sensor that senses an amount of current output through the output port; a user input that is configured to receive information relating to the resistance of a cabling connection between the programmable power supply output port and a radio; and a control module that is configured to control the conversion circuit in response to information relating to the resistance of the cabling connection and the sensed amount of current to adjust the voltage of the output signal that is output through the output port so that the voltage at the far end of the cabling connection may remain substantially constant despite changes in the current drawn by the radio.

In some embodiments, the information relating to the resistance of the cabling connection may comprise a length of the cabling connection and a size of the conductor of the cabling connection.

Pursuant to additional embodiments of the present invention, methods of powering a cellular radio that is located remotely from a power supply and an associated baseband unit and that is connected to the power supply by a cabling connection are provided in which a DC power signal is output from the power supply and the DC power signal that is output from the power supply is supplied to the radio over the cabling connection. A voltage level of the DC power signal that is output from the power supply is adjusted in response to a current level of the DC power signal that is output from the power supply so that the voltage of the DC power signal at a radio end of the cabling connection is maintained at a pre-selected level, range or pattern.

In some embodiments, the voltage level of the DC power signal that is output from the power supply is adjusted in response to a feedback signal that is transmitted to the power supply from a remote location. The feedback signal may include information regarding the measured voltage of the DC power signal at the radio end of the power cable.

Pursuant to yet additional embodiments of the present invention, methods of powering a radio that is mounted on a tower of a cellular base station (or other location remote from an associated baseband unit) are provided in which a DC power signal is output from a power supply and the DC power signal that is output from the power supply is supplied to the radio over a power cable. A voltage of the DC power signal is measured at a radio end of the power cable that is remote from the power supply. Information regarding the measured voltage of the DC power signal at the radio end of the power cable is communicated to the power supply. A voltage level of the DC power signal that is output from the power supply is adjusted in response to the received information regarding the measured voltage of the DC power signal at the radio end of the power cable.

In some embodiments, the voltage level of the DC power signal that is output from the power supply may be adjusted in response to the received information to maintain the DC power signal at the radio end of the power cable at a substantially constant voltage notwithstanding variation in a current level of the DC power signal.

DETAILED DESCRIPTION

Figure 1:
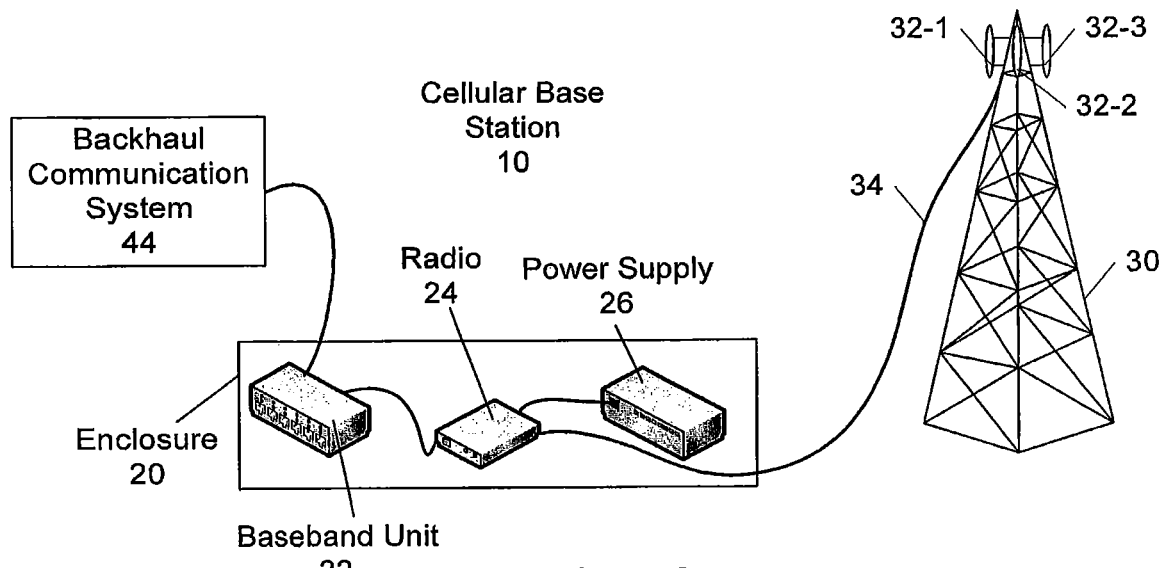
FIG. 1 is a simplified, schematic view of a traditional cellular base station architecture.
Figure 2:
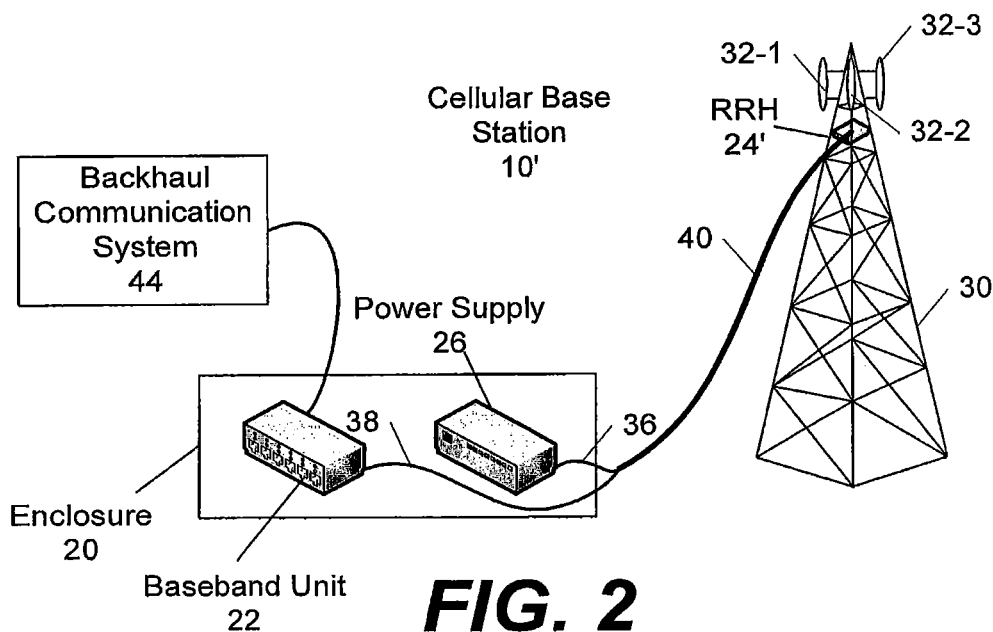
FIG. 2 is a simplified, schematic view of a conventional cellular base station in which a remote radio head is located at the top of the antenna tower.

Pursuant to embodiments of the present invention, methods for delivering DC power to a remote radio head ("RRH") of a cellular base station are provided, along with related cellular base stations, programmable power supplies, power cables and other equipment. These methods, systems, power supplies, cables and equipment may allow for lower power supply currents, which may reduce the power loss associated with delivering the DC power signal from the power supply at the base of a tower of the cellular base station to the remote radio head at the top of the tower. Since cellular towers may be hundreds of feet tall and the voltage and currents required to power each remote radio head may be quite high (e.g., about 50 Volts at about 20 Amperes of current), the power loss that may occur along the hundreds of feet of cabling may be significant. Thus, the methods according to embodiments of the present invention may provide significant power savings which may reduce the costs of operating a cellular base station. Additionally, since the cellular base stations may use less power, the cellular base stations according to embodiments of the present invention may require fewer back-up batteries while maintaining operation for the same period of time during a power outage. This reduction in the amount of back-up batteries may represent a significant additional cost savings.

The DC voltage of a power signal that is supplied to a remote radio head from a power supply over a power cable may be determined as follows:

$$V_{RRH} = V_{PS} - V_{Drop} \quad (1)$$

where $V_{RRH}$ is the DC voltage of the power signal delivered to the remote radio head, $V_{PS}$ is the DC voltage of the power signal that is output by the power supply, and $V_{Drop}$ is the decrease in the DC voltage that occurs as the DC power signal traverses the power cable connecting the power supply to the remote radio head. It will be appreciated that the power cable that connects the power supply to the remote radio head will typically have multiple segments. For example, in cellular base stations in which a trunk cable is used, the power cabling connection will typically include a power jumper cable that connects the power supply to one end of the trunk cable, the power conductors in the trunk cable, and a power jumper cable that connects the other end of the trunk cable to the remote radio head. $V_{Drop}$ in Equation (1) may be determined according to Ohm's Law as follows:

$$V_{Drop} = I_{Cable} * R_{Cable} \quad (2)$$

where $R_{Cable}$ is the cumulative electrical resistance (in Ohms) of the power cable connecting the power supply to the remote radio head and $I_{Cable}$ is the average current (in Amperes) flowing through the power cable to the remote radio head and back to the power supply.

The cumulative electrical resistance $R_{Cable}$ of the power cable is inversely proportional to the diameter of the conductor of the power cable (assuming the conductors have a circular cross-section). Thus, the larger the diameter of each conductor (i.e., the lower the gauge of the conductor), the lower the resistance of the power cable. Typically, power cables utilize copper conductors due to the low resistance of copper. Copper resistance is specified in terms of unit length, typically milliohms (mΩ)/ft; as such, the cumulative electrical resistance $R_{Cable}$ of the power cable increases with the length of the power cable. Thus, the longer the power cable, the higher the voltage drop $V_{Drop}$.

Typically, a minimum required voltage for the power signal, a nominal or recommended voltage for the power signal and a maximum voltage for the power signal will be specified for the remote radio head. Thus, the power supply at the base of the tower must output a voltage $V_{PS}$ such that $V_{RRH}$ will be between the minimum and maximum specified voltages for the power signal of the remote radio head. As $V_{Drop}$ is a function of the current $I_{Cable}$ that is supplied to the remote radio head (see Equation (2) above), if $V_{PS}$ (the voltage output by the power supply) is constant, then the voltage $V_{RRH}$ of the power signal that is delivered to the remote radio head will change with the variation in current $I_{Cable}$ drawn by the remote radio head from the power supply. Conventionally, the voltage output of the power signal by the power supply ($V_{PS}$) is set to ensure that a power signal having the nominal specified voltage is supplied to the remote radio head (or at least a value above the minimum required voltage for the power signal) when the remote radio head draws the maximum anticipated amount of current from the power supply.

The power that is lost ($P_{Loss}$) in delivering the power signal to the remote radio head over a power cable may be calculated as follows:

$$P_{Loss} = V_{Drop} * I_{Cable} = (I_{Cable} * R_{Cable})*$$
$$I_{Cable} = I_{Cable}^2 * R_{Cable} \quad (3)$$

In order to reduce or minimize $P_{Loss}$, the power supply may be set to output a DC power signal that, when it arrives at the remote radio head, will have a voltage that is near the maximum voltage specified for the remote radio head, as the higher the voltage of the power signal that is delivered to the remote radio head, the lower the current $I_{Cable}$ of the power signal on the power cable. As is apparent from Equation (3) above, the lower the current $I_{Cable}$ of the power signal on the power cable, the lower the power loss $P_{Loss}$.

Pursuant to embodiments of the present invention, the power supply may comprise a programmable power supply which may (1) sense the current being drawn by the remote radio head (or another equivalent parameter) and (2) adjust the voltage of the power signal that is output by the power supply to substantially maintain the voltage of the power signal that is supplied to the remote radio head at or near a desired value, which may be, for example, the maximum voltage for the power signal that may be input to the remote radio head. In order to accomplish this, the resistance of the power cable may be input to the programmable power supply or, alternatively, other information such as, for example, the length and size of the power cable, or the impedance of the power cable, may be input to the programmable power supply and the programmable power supply may determine the resistance of the power cable from this information. As the current drawn by the remote radio head varies, the programmable power supply may adjust the voltage of its output power signal to a voltage level that will deliver a power signal having a preselected voltage (e.g., the maximum supply voltage of the remote radio head minus a buffer) to the remote radio head. As shown by Equation (3) above, this will reduce the power loss along the power cable, and hence may reduce the cost of powering the remote radio head. As a typical remote radio head may require about a kilowatt of power and may run 24 hours a day, seven days a week, and as a large number of remote radio heads may be provided at each cellular base station (e.g., three to twelve), the power savings may be significant.

Embodiments of the present invention will now be discussed in more detail with reference to FIGS. 3-14, in which example embodiments of the present invention are shown.

Figure 3:
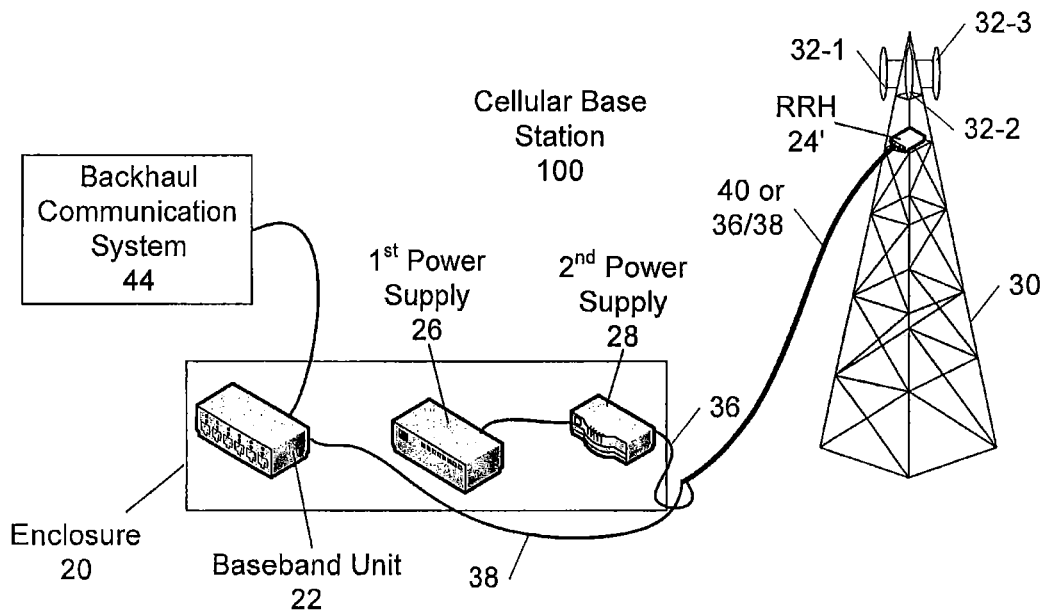
FIG. 3 is a simplified, schematic view of a cellular base station according to embodiments of the present invention.

FIG. 3 is a schematic block diagram of a cellular base station 100 according to embodiments of the present invention. As shown in FIG. 3, the cellular base station 100 includes an equipment enclosure 20 and a tower 30. The tower 30 may be a conventional antenna or cellular tower or may be another structure such as a utility pole or the like. A baseband unit 22, a first power supply 26 and a second power supply 28 are located within the equipment enclosure 20. An remote radio head 24' and plurality of antennas 32 (e.g., three sectorized antennas 32-1, 32-2, 32-3) are mounted on the tower 30, typically near the top thereof.

The remote radio head 24' receives digital information and control signals from the baseband unit 22 over a fiber optic cable 38 that is routed from the enclosure 20 to the top of the tower 30. The remote radio head 24' modulates this information into an RF signal at the appropriate cellular frequency that is then transmitted through one or more of the antennas 32. The remote radio head 24' also receives RF signals from one or more of the antennas 32, demodulates these signals, and supplies the demodulated signals to the baseband unit 22 over the fiber optic cable 38. The baseband unit 22 processes the demodulated signals received from the remote radio head 24' and forwards the processed signals to the backhaul communications system 44. The baseband unit 22 also processes signals received from the backhaul communications system 44 and supplies them to the remote radio head 24'. Typically, the baseband unit 22 and the remote radio heads 24' each include optical-to-electrical and electrical-to-optical converters that couple the digital information and control signals to and from the fiber optic cable 38.

The first power supply 26 generates one or more DC power signals. The second power supply 28 in the embodiment of FIG. 3 comprises a DC-to-DC converter that accepts the DC power signal output by the first power supply 26 as an input and outputs a DC power signal having a different voltage. A power cable 36 is connected to the output of the second power supply 28 and is bundled together with the fiber optic cable 38 so that the two cables 36, 38 may be routed up the tower 30 as an integral unit. In other embodiments, a hybrid power/fiber optic trunk cable 40 may be routed up the tower 30, and jumper cables may be connected between each end of the trunk cable 40 and the baseband units 22, power supply 28 and remote radio heads 24'. In such embodiments, the power jumper cables and the power portion of the trunk cable 40 comprise the power cable 36. While the first power supply 26 and the second power supply 28 are illustrated as separate power supply units in the embodiment of FIG. 3, it will be appreciated that the two power supplies 26, 28 may be combined into a single power supply unit in other embodiments.

As noted above, pursuant to embodiments of the present invention, DC power supplies are provided that may deliver a power signal to a remote radio head 24' with reduced power loss. In the embodiment of FIG. 3, the power supply 28 comprises a programmable power supply that receives an input DC power signal from power supply 26 and outputs a DC power signal to the power cable 36. Pursuant to embodiments of the present invention, the voltage of the DC power signal output by the power supply 28 may vary in response to variations in the current of the DC power signal drawn from the power supply 28 by the remote radio head 24'. In particular, the voltage of the DC power signal output by the power supply 28 may be set, for example, so that the voltage of the DC power signal at the far end of the power cable 36 (i.e., the end adjacent the remote radio head 24') is relatively constant. If the voltage of the DC power signal at the far end of power cable 36 is set to be at or near the maximum specified voltage for the power signal of the remote radio head 24', then the power loss associated with supplying the DC power signal to the remote radio head 24' over the power cable 36 may be reduced, since the higher DC power signal voltage will correspondingly reduce the current of the DC power signal that is supplied over the power cable 36.

State-of-the-art remote radio heads 24' are often designed to be powered by a 48 Volt (nominal) DC power signal. While the minimum DC power signal voltage at which the remote radio head 24' will operate and the maximum DC power signal voltage that may be provided safely to the remote radio head 24' without the threat of damage to the remote radio head 24' vary, typical values are a 38 Volt minimum DC power signal voltage and a 56 Volt maximum DC power signal voltage. Thus, according to embodiments of the present invention, the programmable power supply 28 may be designed to deliver a DC power signal having a relatively constant voltage of, for example, about 54 or 52 Volts at the far end of the power cable 36 (i.e., about, 2-4 Volts less than the maximum DC power signal voltage for the remote radio head 24') in order to reduce the power loss associated with the voltage drop that the DC power signal experiences traversing the power cable 36.

In order to maintain the voltage of the DC power signal at the far end of the power cable 36 at or near a predetermined value (or within a pre-selected range), it may be necessary to know two things. First, the current $I_{Cable}$ of the DC power signal drawn from the power supply must be known, as Equations (1) and (2) show that $V_{RRH}$ is a function of the current $I_{Cable}$. Second, the resistance $R_{Cable}$ of the power cable 36 must also be known, as it too affects the voltage drop. The programmable power supplies according to embodiments of the present invention may be configured to measure, estimate, calculate or receive both values.

Figure 4:
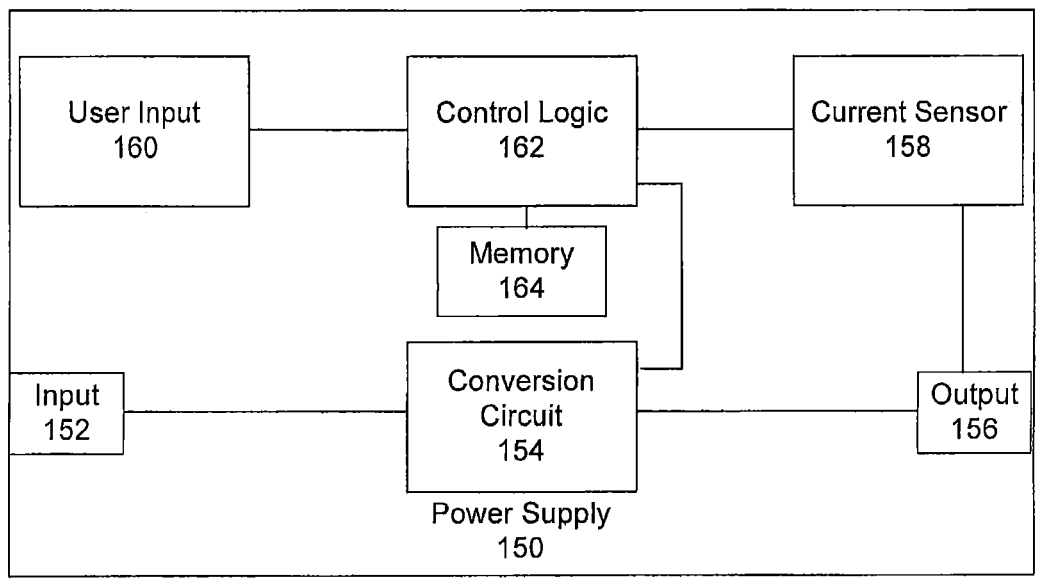
FIG. 4 is a schematic block diagram of a programmable power supply according to embodiments of the present invention.

For example, FIG. 4 is a block diagram of a programmable power supply 150 in the form of a DC-to-DC converter according to certain embodiments of the present invention that may be used as the power supply 28 of FIG. 3. As shown in FIG. 4, the programmable power supply 150 includes an input 152, a conversion circuit 154 and an output 156. The power supply 150 further includes a current sensor 158, a user input 160, control logic 162 and a memory 164.

The input 152 may receive a DC power signal such as the DC power signal output by power supply 26 of FIG. 3. The DC power signal that is received at input 152 may be a DC power signal having a relatively constant voltage in some embodiments. The conversion circuit 154 may be a circuit that is configured to convert the voltage of the signal received at input 152 to a different DC voltage. A wide variety of DC conversion circuits are known in the art, including, for example, electronic, electrochemical and electromechanical conversion circuits. Most typically electronic circuits using inductors or transformers are used to provide high efficiency voltage conversion. The output 156 may output the DC power signal having the converted voltage.

The current sensor 158 may be any appropriate circuit that senses the current level of the DC power signal output through the output 156. For example, the current sensor 158 may be implemented using a resistor having a known value along the power supply conductor or the return conductor internal to the power supply 158, along with a voltage meter that measures the voltage drop across the resistor, and the current may then be calculated according to Ohm's Law. It will also be appreciated that the current sensor 158 may be located external to the power supply 150 in other embodiments. The current drawn by the remote radio head 24' may vary over time depending upon, for example, the number of carriers that are transmitting at any given time and whether the remote radio head 24' is in a steady-state mode, powering up or rebooting. The current sensor 158 may sense the current level of the DC power signal at the output 156 and provide the sensed current level to the control logic 162. The control logic 162 may then adjust parameters of the conversion circuit 154 so as to adjust the voltage of the DC power signal output through output 156 so that the voltage at the far end of the power cable 36 that is attached to output 156 may remain, for example, substantially constant despite changes in the current drawn by the remote radio head 24' and corresponding changes in the voltage drop that occurs over the power cable 36.

While FIG. 4 illustrates a power supply 150 that comprises a DC-to-DC converter, it will be appreciated that in other embodiments an AC-to-DC converter may be used instead. In such embodiments, the input 152 receives an alternating current ("AC") power signal and the conversion circuit 154 converts the AC power signal to a DC power signal and also adjusts the voltage level of the DC power signal that is output through output 156 to an appropriate level in the manner discussed above.

As noted above, in some embodiments, the voltage of the power signal that is output by the power supply 150 may be set so that the voltage at the far end of the power cable 36 remains at or near a predetermined voltage level that is just under a maximum power signal voltage level that is specified for the remote radio head 24'. In order to achieve this, it is necessary to know the voltage drop that the DC power signal will experience traversing the power cable 36, as this voltage drop affects the voltage of the DC power signal at the far end of the power cable 36. In some embodiments, the user input 160 to the power supply 150 allows a user to input a cumulative resistance value for the power cable 36 which the user may obtain by, for example, calculation (based on the length, size and material of the conductor of the power cable 36), measurement (done, for example, by transmitting a signal over the power cable 36 and measuring the voltage of the signal output at the far end of the power cable 36) or a combination thereof (e.g., measuring or estimating a cumulative impedance value for the power cable 36 and converting this cumulative impedance value into a cumulative resistance value). In other embodiments, the user may input physical characteristics of the power cable 36 such as size, length, conductor material, model number, etc.) and algorithms, equations, look-up tables and the like that are stored in the memory 164 of the power supply 150 may be used to calculate or estimate the resistance of the power cable 36. In still other embodiments, the resistance of the power cable 36 may already be known because it was measured or otherwise determined by the cable manufacturer. By way of example, the power cable 36 may have the resistance printed on the jacket thereof, coded into a bar code that is provided on the power cable 36 or stored in an RFID chip that is part of the power cable.

Figure 5:
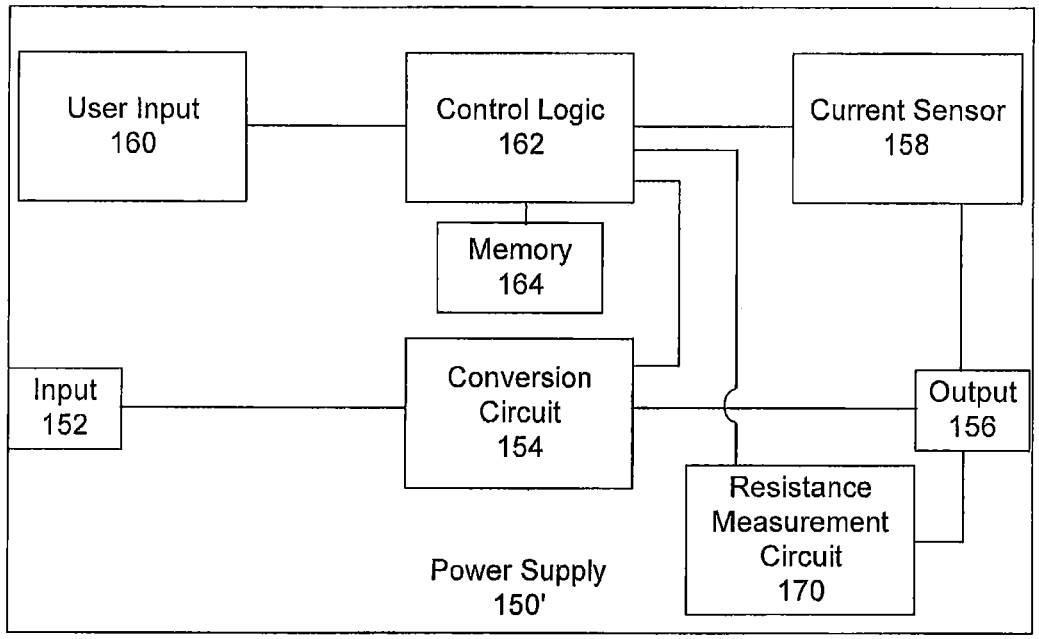
FIG. 5 is a schematic block diagram of a programmable power supply according to further embodiments of the present invention.

In some embodiments, the second power supply 28 of FIG. 3 may further be configured to measure a resistance of the power cable 36. For example, FIG. 5 is a block diagram of a programmable power supply 150' according to further embodiments of the present invention that may be used to implement the power supply 28 of FIG. 3. The power supply 150' is very similar to the power supply 150 of FIG. 4, except that it further includes a cable resistance measurement circuit 170 that may be used to measure a resistance of the power supply cable. The cable resistance measurement circuit 170 may be implemented in a variety of ways. For example, in some embodiments, the cable resistance measurement circuit 170 may transmit a voltage pulse onto the power cable 36 and measure the reflected return pulse (the far end of the power cable may be terminated with a termination having known characteristics). The current of the voltage pulse may be measured, as well as the voltage level of the reflected return pulse. The control logic 162 may then apply Ohm's law to calculate the resistance of the power cable 36. In other embodiments, at the far end of the power cable 36 the two conductors thereof may be shorted and a voltage pulse may again be transmitted through the power cable 36. The current level of the pulse and the voltage level of the return pulse may be measured and the control logic 162 may again use these measured values to calculate the resistance of the power cable 36. In other embodiments, the DC resistance can be measured by transmitting alternating current signals at different frequencies over the power cable 36 and measuring the amplitude and phase shift of these signals at the far end of the power cable 36. The DC resistance may then be calculated using the measured results. Other ways of measuring the resistance of a wire segment are known to those of skill in the art and may be used instead of the example methods listed above. Additional techniques for determining the resistance are also discussed below.

It will also be appreciated that in other embodiments the resistance measurement circuit 170 may measure an impedance of the power cable 36 and use this measured impedance value to determine the resistance of the power cable 36. It will also be appreciated that the power supply 150' may alternatively comprise an AC-to-DC converter, similar to power supply 150 discussed above.

Figure 6:
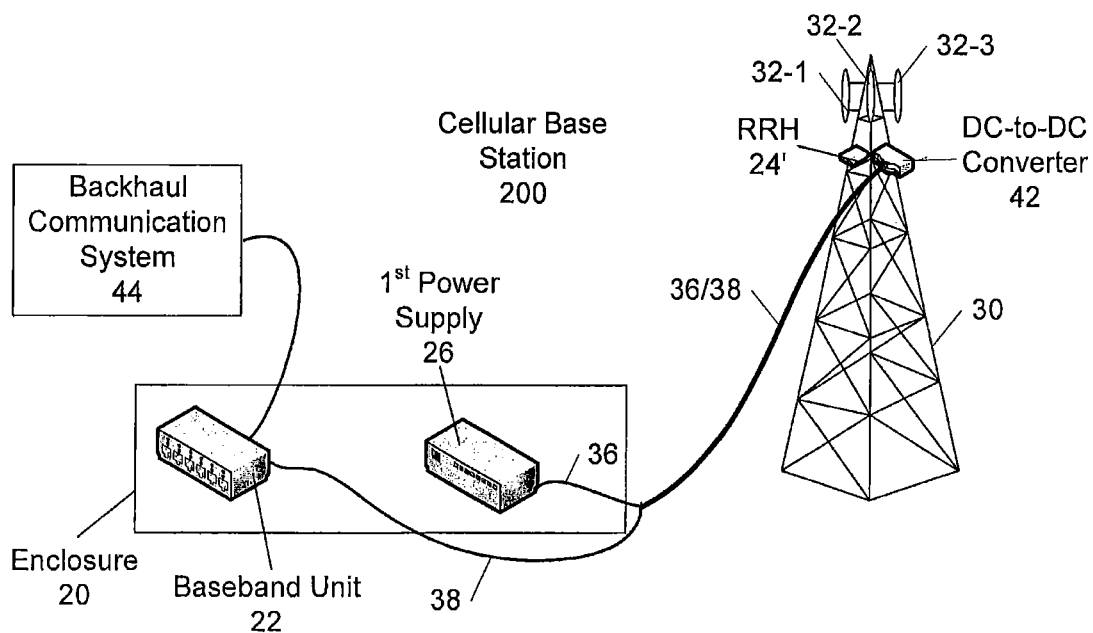
FIG. 6 is a simplified, schematic view of a cellular base station according to still further embodiments of the present invention.

Another technique for reducing the power loss associated with supplying power to a tower-mounted remote radio head of a cellular base station is to dramatically increase the voltage of the DC power signal fed to the power cable that supplies the DC power signal to the remote radio head, (i.e., well beyond the maximum specified voltage for the DC power signal that can be handled by the remote radio head), and then using a tower-mounted DC-to-DC converter power supply to step-down the voltage of the DC power signal to a voltage level that is appropriate for the remote radio head. As the increased voltage reduces the current necessary to supply the wattage required by the remote radio head, the power loss along the power cable may be reduced (see Equation (2) above). This is referred to as a "Buck-Boost" scheme where the DC-to-DC converter at the bottom of the tower is a "Boost" converter that increases the voltage of the DC power signal above the necessary level to operate the remote radio head and the DC-to-DC converter at the top of the tower is a "Buck" converter that reduces the voltage of the DC power signal to a desired level. FIG. 6 is a simplified, schematic view of a cellular base station 200 that implements such a technique.

As shown in FIG. 6, the cellular base station 200 is similar to the cellular base station 100 described above with reference to FIG. 3, except that the cellular base station 200 further includes a third power supply 42 in the form of a tower-mounted DC-to-DC converter. In the depicted embodiment, the second power supply 28 of FIG. 3 is omitted, and the first power supply 26 is configured to supply a DC power signal having a voltage that is significantly higher than the maximum voltage for the DC power signal that may be supplied to the remote radio head 24' (e.g., a 150 volt DC power signal). This high voltage DC power signal may experience significantly less power loss when traversing the power cable 36. The DC-to-DC converter 42 is mounted at the top of the tower 30 between the far end of cable 36 and the remote radio head 24'. The DC-to-DC converter 42 may be a Buck converter that decreases the voltage of the DC power signal received over the power cable 36 to a voltage level appropriate for supply to the remote radio head 24'.

Figure 7:
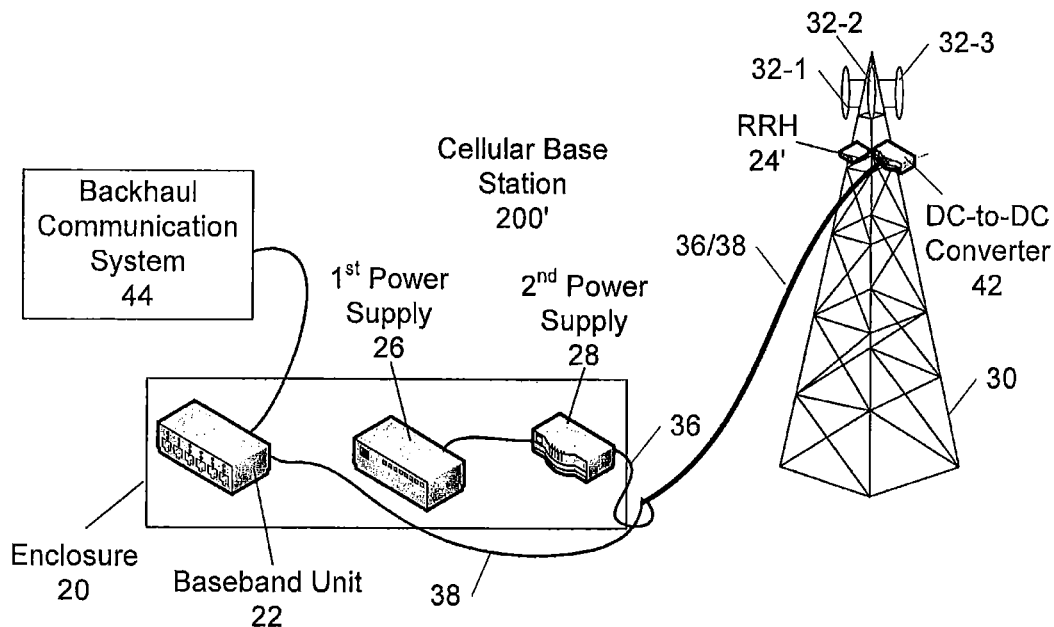
FIG. 7 is a simplified, schematic view of a cellular base station according to yet additional embodiments of the present invention.

As is shown in FIG. 7, in other embodiments, the second power supply 28 may be included in the form of, for example, a DC-to-DC Boost power converter 28 that supplies a high voltage DC power signal (e.g., 150 volts) to the power cable 36. In this embodiment, a DC-to-DC converter is provided at both ends of the power cable 36 so that both of the above-described techniques for reducing power losses in the power cable 36 may be implemented. In particular, the second power supply 28 may output a DC power signal having high voltage (e.g., on the order of 150 volts) that fluctuates with power requirements of the remote radio head 24' so that the DC power signal that is supplied at the far end of power cable 36 is set at a relatively constant value. The tower-mounted DC-to-DC converter 42 may be a simple device that down-converts the voltage of the DC power signal by a fixed amount X. The power supply 28 may be programmed to deliver a DC power signal to the tower-mounted DC-to-DC converter 42 that has a voltage level that is set as follows:

$$\text{Voltage of Delivered Power Signal} = V_{RRH\text{-}Max} - V_{margin} + X \quad (4)$$

where $V_{RRH\text{-}Max}$ is the maximum power signal voltage that the remote radio head 24' is specified to handle, $V_{margin}$ is a predetermined margin (e.g., 2 Volts), and X is the magnitude of the voltage conversion applied by the tower-mounted DC-to-DC converter 42.

One disadvantage of the approaches of FIGS. 6 and 7 is that they require the installation of additional equipment (i.e., the DC-to-DC converter 42) at the top of the tower 30. As the cost associated with sending a technician up a tower may be very high, there is generally a preference to reduce or minimize, where possible, the amount of equipment that is installed at the top of a cellular base station tower, and the equipment that is installed at the top of cellular towers tends to be expensive as it typically is designed to have very low failure rates and maintenance requirements in order to reduce the need for technician trips up the tower to service the equipment. The inclusion of an additional DC-to-DC converter 42 also represents a further increase in capital expenditures, which must be weighed against the anticipated savings in operating costs.

Thus, pursuant to embodiments of the present invention, a DC power signal may be supplied to a tower-mounted remote radio head (or other equipment) of a cellular base station over a power cable, where the DC power signal that is supplied to the remote radio head may have, for example, a relatively constant voltage level or a voltage level within a pre-selected range, regardless of the current drawn by the remote radio head. The voltage level of the DC power signal supplied to the remote radio head may be set to be at or near a maximum power signal voltage that the remote radio head can handle, thereby reducing the power loss of the DC power signal. In this manner, the operating costs for the cellular base station may be reduced.

In some embodiments, the programmable power supply according to embodiments of the present invention may comprise a DC-to-DC converter that may be connected between a power supply of an existing base station and the power cable that supplies the power signal to a tower-mounted remote radio head. Thus, by adding a single piece of equipment at the bottom of the tower, an existing cellular base station may be retrofitted to obtain the power savings available using the techniques according to embodiments of the present invention.

While the above-described embodiments of cellular base stations according to embodiments of the present invention include a first, conventional DC power supply 26 and a second DC-to-DC converter power supply 28, it will be appreciated that in other embodiments these two power supplies may be replaced with a single programmable power supply that may be configured to output a relatively constant voltage at the far end of the power cable 36 in the manner described above.

Figure 8:
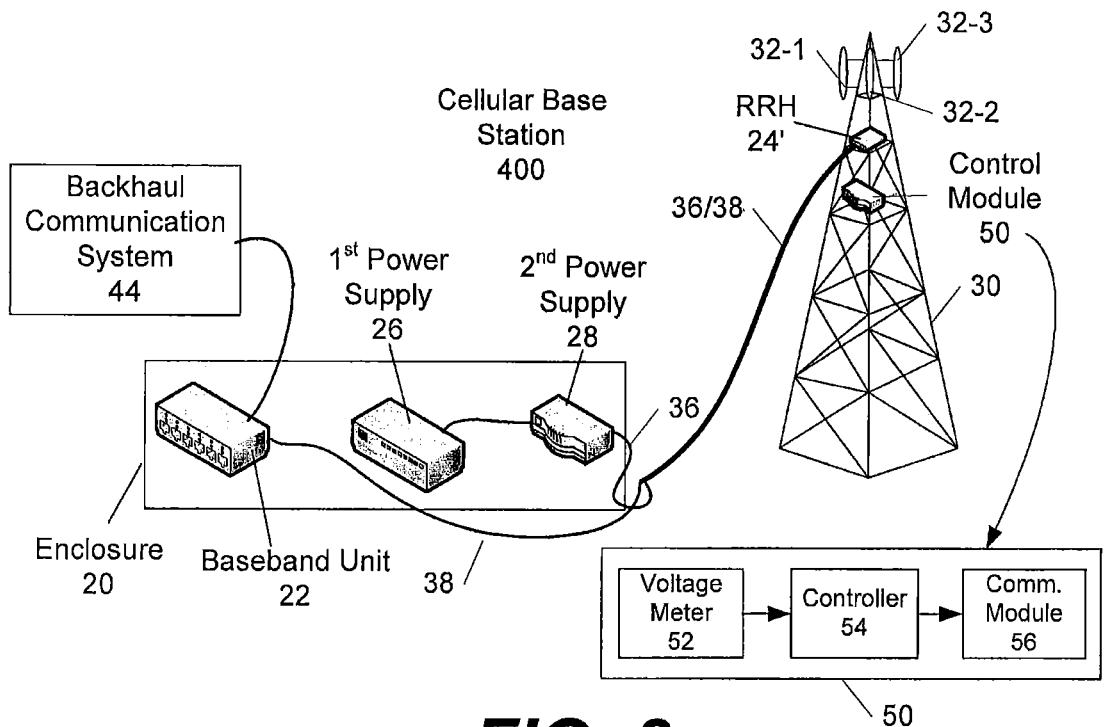
FIG. 8 is a simplified, schematic view of a cellular base station according to yet further embodiments of the present invention.

Pursuant to further embodiments of the present invention, a feedback loop may be used to control the voltage of the DC power signal output by the DC power supply so that the voltage of the DC power signal at the far end of the power cable that connects the power supply and the remote radio head is maintained at a desired level or within a desired range. FIG. 8 is a simplified, schematic view of one example embodiment of a cellular base station 400 that implements such a technique.

As shown in FIG. 8, the cellular base station 400 is similar to the cellular base station 100 described above with reference to FIG. 3, except that the cellular base station 400 further includes a DC power signal voltage control module 50 that is co-located with the remote radio head 24'. The DC power signal voltage control module 50 may be located, for example, at or near the top of the tower 30. In an example embodiment, the DC power signal voltage control module 50 may include a voltage meter 52, a controller 54 and a communications module 56. The voltage meter 52 may be used to monitor the voltage of the DC power signal at the far end of the power cable 36 (i.e., at the top of the tower 30). Any appropriate voltage meter may be used that is capable of measuring the voltage of the DC power signal at the far end of cable 36 (or at another location proximate the remote radio head 24') or that may measure other parameters which may be used to determine the voltage of the DC power signal at the far end of cable 36.

The voltage meter 52 may supply the measured voltage (or other parameter) to the controller 54. The controller 54 may then control the communications module 56 to transmit the measured or calculated voltage of the DC power signal at the far end of power cable 36 to, for example, the second power supply 28. The controller 54 may comprise any appropriate processor, controller, ASIC, logic circuit or the like. The communications module 56 may comprise a wired or wireless transmitter. In some embodiments, the communications module 56 may comprise a wireless Bluetooth transmitter or a cellular transmitter. In other embodiments, the communications module 56 may communicate with the second power supply 28 over a separate wired connection. In still other embodiments, the communications module 56 may communicate with the second power supply 28 by modulating a signal onto the power cable 36. In each case, the communications module 56 may transmit the measured or calculated voltage of the DC power signal at the far end of power cable 36 (i.e., at the top of the tower 30) to the second power supply 28. The second power supply 28 may adjust the voltage of the DC power signal that it outputs in response to these communications in order to generally maintain the voltage of the DC power signal at the far end of power cable 36 at a desired and/or pre-selected level or range. Thus, in this embodiment, an active feedback loop may be used to maintain the voltage of the DC power signal at the far end of power cable 36 at the pre-selected level.

The power signal voltage control module 50 may be a standalone unit or may be integrated with other equipment such as, for example, the remote radio head 24'.

While the embodiments that have been described above deliver a DC power signal over the power cable 36, it will be appreciated that in other embodiments, an AC power signal may be used instead. For example, if the remote radio heads 24' are designed to be powered by an AC power signal as opposed to a DC power signal, then the power supply 28 may output an AC power signal as opposed to a DC power signal, but may otherwise operate in the same fashion. Likewise, in embodiments that include a DC-to-DC converter 42 at the top of the tower 30, an AC-to-DC converter may be used instead or, if the remote radio head 24' is designed to be powered by an AC power signal, the DC-to-DC converter 42 may be replaced with a Buck AC-to-AC converter. Thus, it will be appreciated that the embodiments illustrated in the figures are exemplary in nature and are not intended to limit the scope of the present invention.

In the various embodiments described above, a single power cable 36 has been provided that connects the power supply 28 to the remote radio head 24'. It will be appreciated, however, that the cabling connection for the power signal between the power supply 28 and the remote radio head 24' may include multiple elements such as two or more power cables 36 that are connected by connectors in other embodiments.

Figure 9:
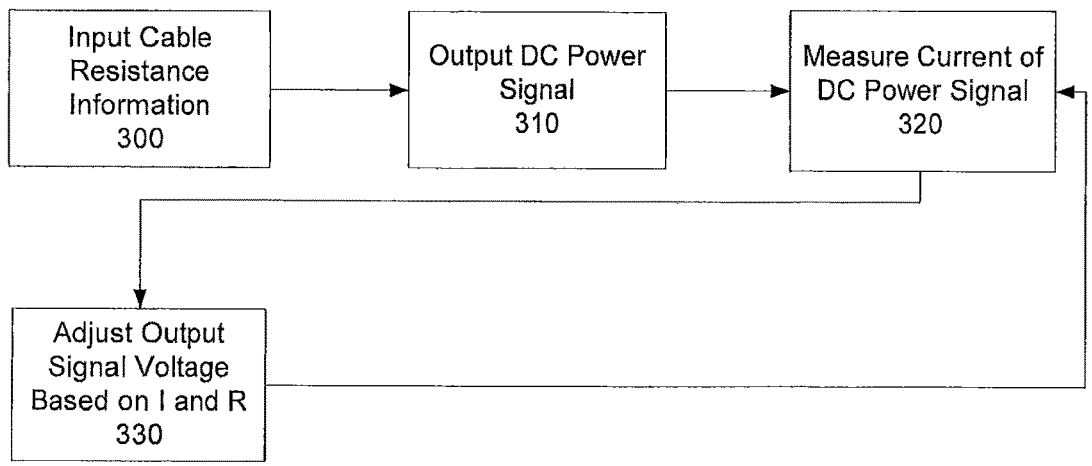
FIG. 9 is a flow chart illustrating operations of methods according to embodiments of the present invention.

A method of powering a radio that is mounted on a tower of a cellular base station according to embodiments of the present invention will now be described with reference to the flow chart of FIG. 9. As shown in FIG. 9, operations may begin with a user inputting information to a programmable power supply which may be used by the programmable power supply to set a voltage level of the power signal that is output by the programmable power supply (block 300). This information may comprise, for example, an electrical resistance of a cabling connection between the power supply and the radio or information regarding the characteristics of the cabling connection that may be used to calculate this resistance. While not shown in FIG. 9, it will be appreciated that in other embodiments the programmable power supply may have the capability to measure and/or calculate the resistance of the cabling connection, thereby avoiding the need for any user input. The programmable power supply may use this information to output a DC power signal that is provided to the remote radio head over the cabling connection (block 310). The current of the DC power signal that is output may then be measured (block 320). The programmable power supply may then automatically adjust a voltage level of the power signal output by the power supply in response to changes in the measured output current so that the power signal that is input to the remote radio head will have a substantially constant, preselected voltage (block 330). As shown in FIG. 9, blocks 320 and 330 are then performed continuously at appropriate intervals in order to maintain the voltage level of the power signal that is input to the remote radio head at the preselected voltage level.

Embodiments of the present invention provide power supplies for powering radio equipment such as a remote radio head that is located remote from the power supply used to power the radio (e.g., the power supply is at the base of a cellular tower and the radio is at the top of the tower) without receiving any feedback from the radio or from other equipment at the remote location. The voltage of the DC power signal supplied by the power supply to the radio over a cabling connection may be controlled to be at a pre-selected level or within a pre-selected range. The pre-selected level or range may be set to reduce or minimize power losses that may be incurred in transmitting the DC power signal over the cabling connection. The voltage of the DC power signal output by the power supply may be varied based on variations in the current drawn from the power supply so that the voltage of the DC power signal at the radio end of the cabling connection may have, for example, a substantially constant value. This value may be selected to be near a maximum value for the voltage of the DC power signal that may be input to the remote radio head.

While typically the voltage of the DC power signal output by the power supply will be adjusted to maintain the voltage of the DC power signal at the radio end of the cabling connection at a set level, it will be appreciated that some variation is to be expected because of the time it takes the DC power supply to adjust the voltage of the DC power signal in response to changes in the current drawn. It will also be appreciated that the voltage of the DC power signal need not be maintained at a constant level at the radio end of the cabling connection but, may instead have different characteristics (e.g., set to be maintained within a predetermined range, set to return to a pre-selected level within a certain time period, etc.) in some embodiments.

In some current cellular systems, the voltage drop that occurs on the DC power signal that is delivered from a power supply located at the bottom of a cellular tower to the remote radio head at the top of the tower may be so large that the voltage of the DC power signal at the top of the tower may be insufficient to run the remote radio head. As a result, larger diameter power cables are used in some cases that exhibit less DC resistance and hence a smaller voltage drop. However, the use of larger power cables has a number of disadvantages, as these cables can be significantly more expensive, add more weight to the tower (requiring that the towers be constructed to handle this additional weight) and more difficult to install.

Pursuant to embodiments of the present invention, this problem may be reduced or solved by controlling the voltage of the DC power signal output by the power supply so that the voltage of the DC power signal at the radio end of the power cabling connection may be at or near a maximum voltage for the DC power signal that may be input to the remote radio head. This scheme reduces the voltage drop of the DC power signal, and hence may allow for the use of smaller diameter power cables and/or longer cabling connections between the power supply and the remote radio head. Additionally, as noted above, as the power losses experienced by the DC power signal are less, the costs of operating the remote radio head may also be reduced.

As discussed above with reference to FIG. 4, in some embodiments of the present invention, the resistance of the power cabling connection between the power supply 28 at the bottom of the tower 30 and the remote radio head 24' at the top of the tower 30 may be measured or otherwise determined. This measured resistance is then used to set the voltage of the power supply signal output by the second power supply 28 in order to maintain the voltage of the power supply signal that is supplied to the remote radio head 24' at the top of the tower 30 at a relatively constant value despite variation in the current drawn by the remote radio head 24'.

In some embodiments, the resistance of the power cabling connection may be determined by sending two signals over the power cabling connection that have different voltages, and then measuring the current of these signals. So long as the power drawn by the remote radio head remains constant during the time that the two signals are transmitted, then the resistance of the power cabling connection may be calculated using known relationships between voltage, current, resistance and power.

In particular, based on Equations (1) and (2) above, the voltage of a first power signal output from the power supply ($V_{PS1}$) relates to the current flowing through the power cabling connection ($I_1$) and the resistance $R_{Cable}$ of the power cabling connection as follows:

$$V_{PS1} = V_{RRH1} + V_{Drop1} = V_{RRH1} + I_1 * R_{Cable} \quad (5)$$

where $V_{RRH1}$ is the voltage of the first power signal as received at the remote radio head, and where $V_{Drop1}$ is the voltage drop experienced by the first power signal in traversing the power cabling connection to the remote radio head.

As noted above, it is assumed that the power (P) that is drawn by the remote radio head remains constant. The relationship between the voltage of the first power signal at the remote radio head and the power (P) drawn by the remote radio head is as follows:

$$V_{RRH1} = P/I_1 \quad (6)$$

Combining Equations (5) and (6), the voltage of the first power signal output from the power supply ($V_{PS1}$) is as follows:

$$V_{PS} = P/I_1 + I_1 * R_{Cable} \quad (7)$$

Solving Equation (7) for the power (P):

$$V_{PS1} - I_1 * R_{Cable} = P/I_1 \quad (8)$$

$$P = (V_{PS} * I_1) - (R_{Cable} * I_1^2) \quad (9)$$

In Equation (9), $V_{PS1}$ is known (as the voltage of the first power signal may be set to a predetermined value), and the value of $I_1$ is measured using, for example, a current sensor in the power supply. The values of P and $R_{Cable}$, however, may not be known.

As noted above, a second power signal ($V_{PS2}$) may then be output from the power supply and the current ($I_2$) of this second power signal is measured. Combining Equations (5) and (6) above with respect to the second power signal, the voltage thereof may be determined as follows:

$$V_{PS2} = P/I_2 + I_2 * R_{Cable} \quad (10)$$

As noted above, if the power (P) drawn by the remote radio head remains constant, then P is the same in Equations (9) and (10). Accordingly incorporating Equation (9) into Equation (10) for the power (P):

$$V_{PS2} = [(V_{PS1} * I_1) - (R_{Cable} * I_1^2)]/I_2 + I_2 * R_{Cable} \quad (11)$$

Solving Equation (11) for $$V_{PS2} * I_2 = V_{PS1} * I_1 - R_{Cable} * I_1^2 + I_2^2 * R_{Cable} \quad (12)$$

$$V_{PS2} * I_2 - V_{PS1} * I_1 = R_{Cable}(I_1^2 + I_2^2) \quad (13)$$

$$R_{Cable} = (V_{PS2} * I_2 - V_{PS1} * I_1)/(I_1^2 + I_2^2) \quad (14)$$

Thus, so long as the power (P) drawn by the remote radio head remains constant, by sending two power signals having different voltages (namely $V_{PS1}$ and $V_{PS2}$) from the power supply and measuring the current of these signals (namely $I_1$ and $I_2$), Equation (14) may be used to determine the resistance $R_{Cable}$ of the power cabling connection.

In order to reduce the likelihood that the power (P) drawn by the remote radio head changes between the times that the first power signal and the second power signal are injected onto the power cabling connection, the first and second power signals may be transmitted with little delay therebetween. As the currents $I_1$ and $I_2$ can be measured very quickly, it may be possible to send the first and second power signals and measure the currents thereof within a very short timeframe such as, for example, a millisecond or even less. Moreover, in some embodiments, the system may be programmed to transmit more than two power signals having different voltages to the remote radio head and measuring the associated currents of these signals in order to either (1) identify and discard power signals that were transmitted during a time when the power (P) drawn by the remote radio head changed or (2) reduce the impact of any such measurements that are made when the power drawn by the remote radio head changed by averaging those measurements with a large number of measurements that were taken at times when the power drawn by the remote radio head did not change.

In some embodiments, the resistance $R_{Cable}$ of the power cabling connection may be calculated using a running average of the voltages and measured currents of a series of power signals that are transmitted over the power cabling connection. For example, if a total of X power signals having different voltages are transmitted over the power cabling connection, the resistance $R_{Cable}$ of the power cabling connection may be determined as follows:

$$R_{Cable} = \Sigma[(V_{PSn+1} * I_{n+1} - V_{PSn} * I_n)/(I_{n+1}^2 + I_n^2)]/X \quad (15)$$

where the summation is performed from n=1 to (X−1).

The resistance $R_{Cable}$ of the power cabling connection may change over time based on a number of factors such as, for example, changes in the ambient temperature, variation in the current drawn (which can affect the temperature), corrosion on the power cable or connectors, and various other factors. These changes, however, tend to not be large and tend to occur gradually over time. By way of example, the resistance of copper changes at a rate of about 0.4% for each change in temperature by one degree Celsius. Thus, if over the course of a day the temperature changes from 80° F. (26.7° C.) to 50° F. (10° C.), the resistance of the power cabling connection may change by nearly 7%. However, for resistance measurements obtained using the above-described techniques that are taken on the order of seconds (or less) apart, the change in resistance due to temperature changes will be almost zero.

In some embodiments, the resistance $R_{Cable}$ of the power cabling connection may be determined using Equation (15) above where "X" is set to a relatively large number (e.g., 100, 1000, etc.). Herein, the elements of the summation in Equation (15) for each different value of "n" may be referred to as a "sample." Using as an example the case where X is set to 500, the voltage of the power supply signal output by the power supply may be varied 500 times and the resistance corresponding to each different voltage may then be measured. By way of example, if at the start of the resistance measurement procedure the power supply is outputting a power supply signal having a voltage of 58 Volts so as to provide a power signal at the input of the remote radio head having a desired voltage (e.g., between 54-56 Volts), during the resistance measurement the voltage of the power supply signal might be toggled every 10 milliseconds between 58 Volts and 57.5 Volts. In this case, the summation in Equation (15) would have 499 samples, and assuming that the current drawn by the remote radio head does not change, each of these samples should theoretically have the same value, although, measurement error, noise, changes in temperature and the like will in practice introduce a small amount of variation. After the 499 samples included in the summation of Equation (15) in this example are determined, they may be reviewed and any sample that appears as an outlier may be discarded, as the outliers are likely associated with a change in the power drawn by the remote radio head. The outliers may be particularly easy to identify as they may tend to occur in consecutive locations in the summation if the voltage of the power supply single is toggled at an appropriate rate.

In the above approach, any appropriate technique may be used for identifying and discarding outliers among the samples summed in Equation (15). In one embodiment, samples that vary by more than a predetermined amount from, for example, an average value may be discarded. In another embodiment, samples that vary by more than a predetermined percentage from an average or median value of a large group of samples that all have approximately the same value may be discarded. Many other algorithms or techniques may be used. In this fashion, distortions that might otherwise be introduced in the resistance calculation can be avoided or at least reduced.

By way of example, after computing the 499 samples in the above-described embodiment, a median value of the 499 samples may be determined. Ones of the 499 samples that deviated from the median sample by more than a predetermined amount such as, for example, a pre-selected percentage (e.g., 5%), might then be discarded. The remaining samples may then be summed to determine the resistance of the power cabling connection.

In other embodiments, the resistance $R_{Cable}$ of the power cabling connection may be determined using Equation (15), even though some error may be introduced by samples taken during periods when the power drawn by the load changed. This approach will introduce some amount of error, although the degree of error may be reduced by performing the resistance calculation more often and/or by using larger numbers of samples.

One advantage of the above-described approaches for determining the resistance $R_{Cable}$ of the power cabling connection is that it allows calculation of the resistance during normal operation by simply toggling or otherwise adjusting the voltage of the power supply signal a small amount during normal operation. The amount of the voltage swing may be selected based on a variety of different factors. Moreover, while in the above examples the voltage is toggled between two different values, it will be appreciated that more than two values may be used.

It should also be noted that an initialization procedure may be used when the cellular base station first goes operational, as initially the appropriate voltage level for the power supply signal may not be known. In this case, a relatively low power supply voltage may be used that is less than the maximum operating voltage of the remote radio head to ensure that a power supply signal having too large a voltage level is not supplied to the remote radio head. Once a resistance measurement has been performed, the voltage levels of the power supply signal may be increased by an appropriate amount in view of the measured resistance and the loading of the remote radio head.

One or more of the techniques for determining the resistance of the power cabling connection that are described above may then be performed on a periodic or non-periodic basis. In this manner, changes in the resistance of the power cabling connection may be identified and the voltage of the power supply signal may be adjusted accordingly. Between a hot summer day and a cold winter night the temperature might vary by as much as 100° F. (55° C.), which corresponds to more than a 20% change in the resistance of the power cabling connection. By adjusting the power supply voltage to account for such changes in the resistance, the current of the power supply signal may be reduced by a corresponding amount, which may result in significant power savings since the power loss due to the voltage drop varies according to the square of the current.

In some embodiments, the power supply 150 of FIG. 5 may be used to measure the resistance based on the above-described techniques. The control logic 162 may toggle the voltage of the power signal output by the power supply 150 in the manner described above, and the current sensor 158 may sense the current of the power signal associated with each different voltage value. The control logic 162 may identify and discard outlying samples using, for example, one of the techniques discussed above, and may determine the resistance of the power cabling connection according to Equation (15).

One potential problem with setting the voltage of the power supply signal that is output by the power supply to a voltage that will result in the power supply signal having a voltage at the remote radio head that is near the maximum specified voltage that the remote radio head may handle is the possibility that power supply signal that is input to the remote radio head may occasionally have a voltage that exceeds the maximum specified power supply voltage for the remote radio head. This may occur, for example, if there is a sudden decrease in the amount of traffic supported by the remote radio head, which will in turn result in a sudden decrease in the current drawn by the remote radio head. This sudden drop in current may significantly reduce the voltage drop along the power cabling connection, thereby increasing the voltage of the power signal received at the remote radio head. While the power supplies according to embodiments of the present invention are designed to adjust the voltage of the power supply signal to compensate for this drop in current, if the voltage of the power supply signal is not adjusted quickly enough, the reduction in the voltage drop may result in the power supply signal at the remote radio head having a voltage that exceeds the maximum specified power signal voltage for the remote radio head. As this may damage the remote radio head, suitable margins may be built into the system to protect the remote radio heads from such possible damage.

Moreover, rapid changes in the current flowing through the power cable may also result in a temporary change in the voltage of the power signal due to the inductance of the cable. When the current of the power signal is rapidly increased, this may result in a phenomena known as the dI/dt voltage drop, which may be determined as follows:

$$V_{dI/dt\ Drop} L*(dI/dt) \quad (16)$$

where L is the cumulative inductance of the conductors and dI/dt is the rate of increase in the current flowing through the conductors with respect to time. When the the current of the power signal is rapidly decreased, the reverse process happens, which may result in a temporary increase in the voltage of the power signal, which is referred to herein as a "dI/dt voltage spike."

Pursuant to further embodiments of the present invention, a shunt capacitance unit may be provided between the two conductors of a power cable that is used to provide a DC power signal to a remote radio head. This shunt capacitance unit may be implemented, for example, using one or more capacitors that are coupled between the power supply and return conductors of the power cable. The shunt capacitance unit may dampen increases in the voltage of the power signal that result from changes in the current drawn by the remote radio head and by the above-discussed dI/dt voltage spikes. As such, a sudden decrease in the current level of the power signal due to a sudden drop in the loading of the remote radio head may result in a smaller and slower reduction in the voltage drop, and hence the shunt capacitance unit may help protect the remote radio head from situations where the current of the power signal drops more quickly than the voltage of the power signal output by the power supply can be adjusted.

By way of example, a remote radio head that is located atop a large antenna tower may specify a maximum voltage of 58 Volts for the power signal. Pursuant to embodiments of the present invention, the voltage of the power signal at the output of the power supply (which is located at the bottom of the tower) that is used to power this remote radio head may be adjusted so that the power signal at the input to the remote radio head has a voltage of approximately 55 Volts. In situations where the remote radio head is drawing a large amount of current, the power supply may output a power signal having a voltage of, for example, 62 volts in order to supply a power signal having 55 Volts to the remote radio head due to the large $I^2R$ power loss along the power cabling connection between the power supply and the remote radio head. If all of the traffic to the remote radio head suddenly drops, the current drawn by the remote radio head will decrease in a dramatic fashion, as will the $I^2R$ power loss along the power cabling connection. As a result, the voltage of the power signal that is delivered to the remote radio head may be on the order of 60 Volts or more if the power supply fails to adjust the output voltage quickly enough, and this 60 Volt power signal may potentially damage electronics in the remote radio head.

Figure 10:
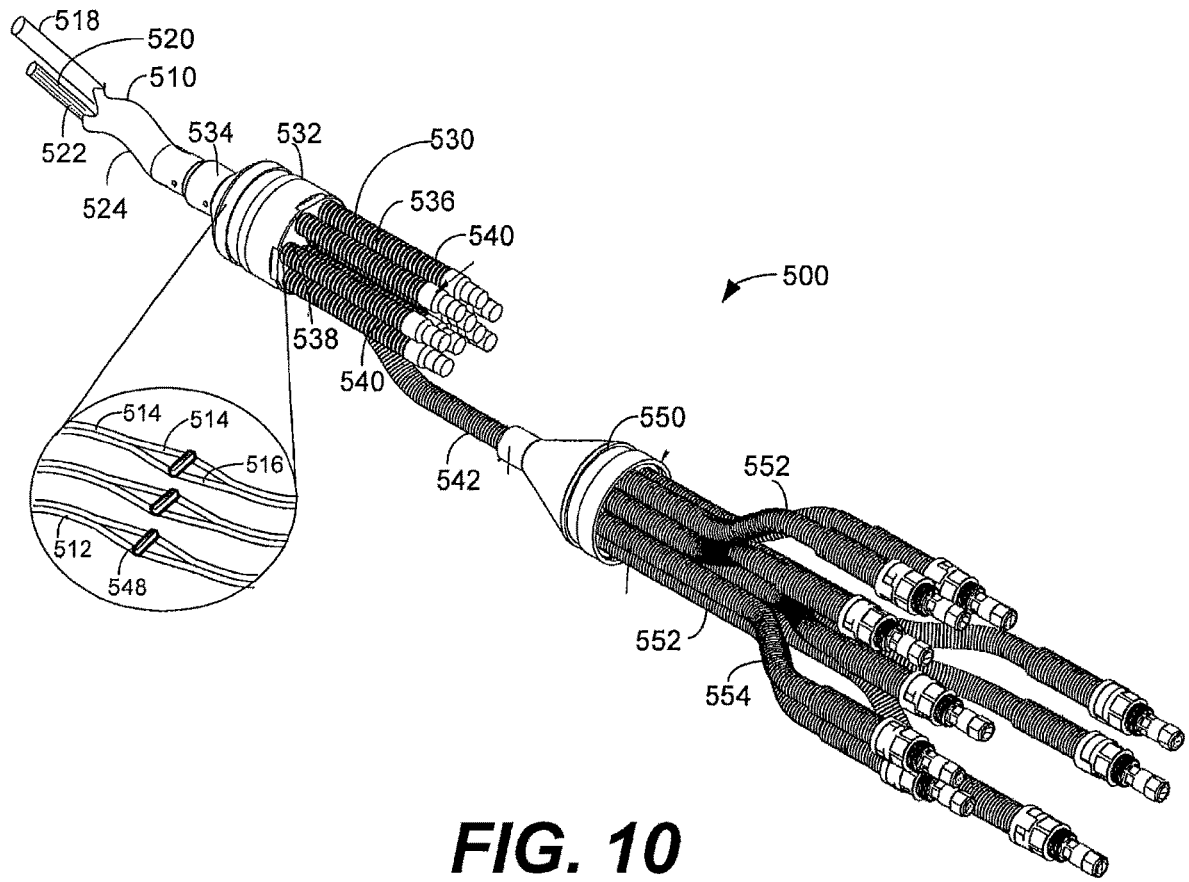
FIG. 10 is a perspective view of an end portion of a hybrid power/fiber optic cable that may be used in cellular base stations according to embodiments of the present invention.

FIG. 10 is a schematic diagram that illustrates a trunk cable assembly 500 that may used, for example, to implement the trunk cable 40 of a cellular base station. The trunk cable assembly 500 includes nine individual power cables and nine sets of four optical fibers, and hence is suitable for transmitting power and data to a cellular base station that includes nine remote radio heads. As an example, if the cellular base station 100 of FIG. 3 were modified to include nine baseband units 22, remote radio heads 24 and twenty-seven antennas 32, then the trunk cable 500 of FIG. 10 would be a suitable replacement for the trunk cable 40 illustrated in FIG. 3. The trunk cable 500 includes shunt capacitances between the two conductors of each of the nine power cables that are used to provide DC power signals to the nine remote radio heads 24. These shunt capacitances may dampen increases in the voltage of the DC power signals that may result from changes in the current drawn by the remote radio head and by associated dI/dt voltage spikes in order to protect the remote radio heads from overshooting the maximum specified voltage for the power signal input thereto.

As shown in FIG. 10, the trunk cable assembly 500 comprises a hybrid power/fiber optic cable 510, a first breakout canister 530 and a second breakout canister 550. The hybrid power/fiber optic cable 510 has nine individual power cables 512 (the callout in FIG. 10 depicts three of these individual power cables 512) that may be grouped together into a composite power cable 518 and a fiber optic cable 520 that includes thirty-six optical fibers 522. The fiber optic cable 520 may comprise a jacketed or unjacketed fiber optic cable of any appropriate conventional design. The composite power cable 518 and the fiber optic cable 520 may be enclosed in a jacket 524. While one example hybrid power/fiber optic cable 510 is shown in FIG. 10, it will be appreciated that any conventional hybrid power/fiber optic cable may be used, and that the cable may have more or fewer power cables and/or optical fibers. An exemplary hybrid power/fiber optic cable is the HTC-24SM-1206-618-APV cable, available from CommScope, Inc. (Hickory, N.C.).

The first breakout canister 530 comprises a body 532 and a cover 536. The body 532 includes a hollow stem 534 at one end that receives the hybrid power/fiber optic cable 510, and a cylindrical receptacle at the opposite end. The cover 536 is mounted on the cylindrical receptacle to form the breakout canister 530 having an open interior. The hybrid power/fiber optic cable 510 enters the body 532 through the stem 534. The composite power cable 518 is broken out into the nine individual power cables 512 within the first breakout canister 530. Each individual power cable 512 includes a power supply conductor 514 and a return conductor 516. The nine individual power cables 512 are routed through respective sockets 538 in the cover 536, where they are received within respective protective conduits 540 such as a nylon conduit that may be sufficiently hardy to resist damage from birds. Thus, each individual power cable 512 extends from the first breakout canister 530 within a respective protective conduit 540. The optical fibers 522 are maintained as a single group and are routed through a specific socket 538 on the cover 536, where they are inserted as a group into a conduit 542. Thus, the first breakout canister 530 is used to singulated the nine power cables 512 of composite power cable 518 into individual power cables 512 that may be run to respective remote radio heads 24, while passing all of the optical fibers 522 to a separate breakout canister 550.

As shown in the inset of FIG. 10, a plurality of shunt capacitance units in the form of ceramic capacitors 548 are provided within the first breakout canister 530. Each capacitor 548 is connected between the power supply conductor 514 and the return conductor 516 of a respective one of the individual power cables 512. For low frequency signals such as a DC power signal, the shunt capacitors 548 appear as an open circuit, and thus the DC power signal that is carried on each individual power cable 512 will pass by the respective shunt capacitors 548 to the remote radio heads 24. However, as discussed above, during periods where the current carried by an individual power cable 512 drops in response to a decreased loading at the remote radio head 24, the shunt capacitor 548 may act to reduce the magnitude of the dI/dt voltage spike on the DC power signal.

As noted above, the optical fibers 522 pass through the first breakout canister 530 as a single unit in conduit 542 which connects to the second breakout canister 550. In the second breakout canister 550, the thirty-six optical fibers 522 are separated into nine optical fiber subgroups 552. The optical fiber subgroups 552 are each protected within a respective conduit 554. The second breakout canister 550 may be similar to the first breakout canister 530 except that it is used to break out the thirty-six optical fibers 522 into nine sets of four optical fibers that are fed into nine respective protective conduits 552.

As discussed above, rapid changes in the power drawn by a remote radio head 24 may result in an increase in the voltage of the power signal received at the remote radio head 24 because (1) the power supply 28 requires some amount of time to sense the reduction in current drawn by the remote radio head 24 and to adjust the voltage of the power supply signal in response thereto and (2) a sudden decrease in the current drawn by the remote radio head 24 may result in a dI/dt voltage spike that momentarily increases the voltage of the power signal at the input to the remote radio head 24. By providing power cables such as the hybrid power/fiber optic cable assembly 500 of FIG. 10 that have shunt capacitors 548 integrated into each individual power cable 512, it is possible to dampen such increases in the voltage of the power signal received at the remote radio head 24, thereby protecting the remote radio head 24 from unintended spikes in the voltage of the power signal that exceed the maximum voltage for the power signal that is specified for the remote radio head.

Those of skill in this art will appreciate that the shunt capacitances 548 may be provided in any number of forms. For example, a shunt capacitance unit may be in the form of individual components, such as one or more capacitors, or in the form of other physical structures such as parallel conductors separated by an air gap that may act like a capacitor. The amount of shunt capacitance provided may vary depending on a number of factors including, for example, how close the voltage of the power signal that is input to the remote radio head 24 is to the maximum specified power signal voltage for the remote radio head 24. Generally speaking, the amount of shunt capacitance may be on the order of hundreds, thousands, tens of thousands, or hundreds of thousands of microfarads in some embodiments.

The use of shunt capacitance units is disclosed in U.S. Patent Application Publication No. 2015/0080055 ("the '055 publication"), although primarily for purposes of dampening a dI/dt voltage drop that may occur in response to sharp increases in the current drawn by a remote radio head. As discussed above, it has been discovered that the use of such a shunt capacitance unit may also be used to protect the remote radio head from situations in which the voltage of the power signal would exceed the maximum power supply voltage specified for the remote radio head by slowing the decrease in the voltage drop and thereby providing the power supply additional time to adjust to the reduced loading at the remote radio head. The '055 publication discloses a variety of ways in which the shunt capacitance unit may be implemented, all of which may be used according to embodiments of the present invention to protect a remote radio head from situations where the voltage of the power signal that is delivered to the remote radio head could overshoot the maximum specified voltage for the remote radio head. The entire content of the '055 publication is incorporated herein by reference in its entirety.

It will also be appreciated that the shunt capacitance units may be placed in a variety of locations other than within a trunk cable as shown in the embodiment of FIG. 10. For example, in many cellular base stations, fiber optic and power jumper cables extend between a breakout enclosure of a trunk cable (e.g., the breakout canisters 530, 550 of FIG. 10) and the remote radio heads. In some cases, separate power jumper cables and fiber optic jumper cables are provided, while in other cases composite jumper cables that include both optical fibers and power conductors (which are separately connectorized) may be used to connect each remote radio head to the junction enclosure. The jumper cables are much shorter in length than the trunk cables, as the breakout enclosure is typically located only a few feet from the remote radio heads, whereas the trunk cable is routed tens or hundreds of feet up the antenna tower. Additionally, the jumper cables include far fewer components. As such, trunk cables are typically far more expensive than jumper cables.

In some embodiments, the shunt capacitance units may be implemented in the power jumper cables or at other locations near the power inputs to the respective remote radio heads. Implementing the shunt capacitance units in the jumper cables may provide a more efficient and cost-effective way of retrofitting existing cellular base stations to include shunt capacitance units. Additionally, jumper cables may be easily replaced by a technician as they are designed to be connected and disconnected, and jumper cable replacement does not raise environmental sealing concerns as does opening a junction enclosure such as a breakout canister of a trunk cable.

Figure 11:
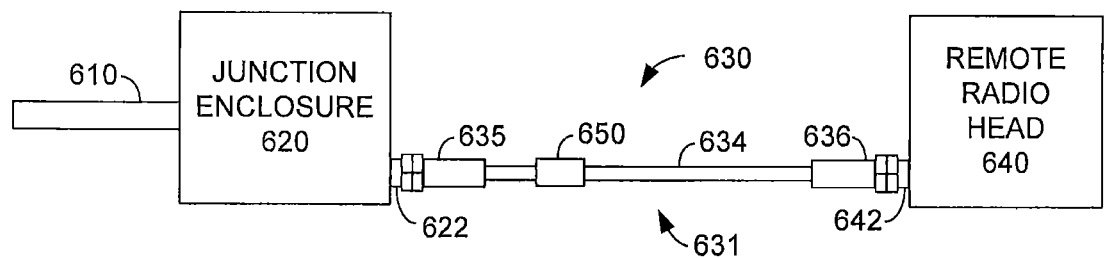
FIG. 11 is a schematic drawing illustrating how a jumper cable that includes a shunt capacitance unit may be used to connect a junction enclosure to a remote radio head in cellular base stations according to embodiments of the present invention.
Figure 12:
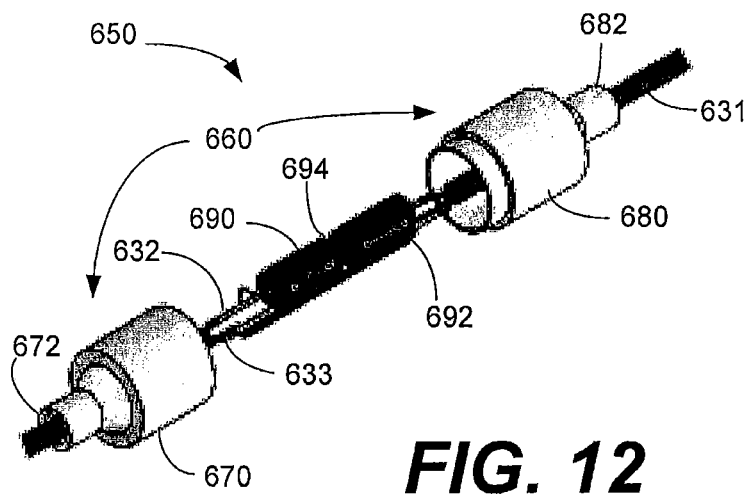
FIG. 12 is a a partially-exploded perspective view of a shunt capacitance unit according to certain embodiments of the present invention.

FIG. 11 is a schematic drawing illustrating how a jumper cable 630 having an associated shunt capacitance unit 650 according to embodiments of the present invention may be used to connect a junction enclosure such as a breakout canister of a trunk cable to a remote radio head. FIG. 12 is a partially-exploded perspective view of an example embodiment of the shunt capacitance unit 650. As shown in FIGS. 11-12, a trunk cable 610 is terminated into or includes a junction enclosure 620 at, for example, the top of an antenna tower (not shown). The jumper cable 630 connects the junction enclosure 620 to a remote radio head 640. The jumper cable 630 includes a cable segment 631 that has a power supply conductor 632 and a return conductor 633 that are electrically insulated from each other (see FIG. 12). In some embodiments, the power supply conductor 632 and the return conductor 633 may each comprise an insulated 8-gauge to 14-gauge copper or copper alloy wire.

A protective jacket 634 may enclose the power supply and return conductors 632, 633. First and second connectors 635, 636 are terminated onto either end of the cable segment 631. The first connector 635 is configured to connect to a mating connector 622 on the junction enclosure 620, and the second connector 636 is configured to connect to a mating connector 642 of the remote radio head 640. The connectors 622, 642 may be identical so that either of connectors 635 and 636 may be connected to either of the connectors 622, 642. The jumper cable 630 may include an associated shunt capacitance unit 650 that may be implemented in a variety of locations.

As shown in FIG. 12, the shunt capacitance unit 650 may be implemented as a sealed unit that is interposed along the cable segment 631. The shunt capacitance unit 650 may have a housing 660 that includes housing pieces 670, 680 that have respective cable apertures 672, 682 that allow the cable segment 631 to pass through the housing 660. The shunt capacitance 650 is implemented using a pair of electrolytic capacitors 690, 692 that are connected in parallel between the power supply conductor 632 and the return conductor 633. The capacitors 690, 692 may have a total capacitance of, for example, between 400 and 2500 microfarads.

The capacitors 690, 692 may comprise non-polar electrolytic capacitors and hence the jumper cable 630 may be installed in either direction between the junction enclosure 620 and the remote radio head 640. A fuse circuit 694 may be provided along the shunt path between the power supply and return conductors 632, 633 that creates an open circuit in the event of failure of the capacitors 690, 692.

While FIG. 12 depicts a jumper cable having a shunt capacitance unit 650 implemented along the cable thereof, it will be appreciated that in other embodiments the shunt capacitance unit 650 may be implemented in one of the connectors 635, 636 of the jumper cable 630. In still other embodiments, the shunt capacitance unit 650 may be implemented as a stand-alone unit that may be connected, for example, between the junction enclosure 620 and a conventional jumper cable or between the remote radio head 640 and a conventional jumper cable.

Figure 13:
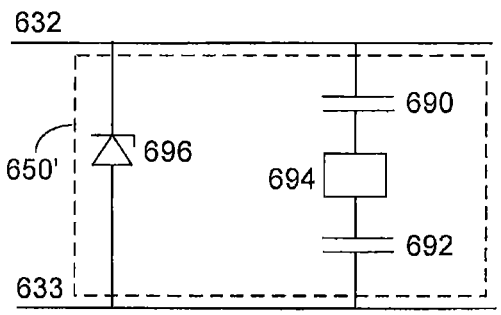
FIG. 13 is a circuit diagram of a shunt capacitance unit that includes an avalanche diode according to embodiments of the present invention.

Pursuant to still further embodiments of the present invention, a protection circuit in the form of an avalanche diode may be coupled in parallel with one of the above-described shunt capacitance units 548, 650 that may be implemented along the power cables of a trunk cable, of a jumper cable, or as a standalone unit. FIG. 13 is a circuit diagram of a shunt capacitance unit 650' that includes such an avalanche diode. As shown in FIG. 13, the shunt capacitance unit 650' is identical to the shunt capacitance unit 650 of FIG. 12, except that the shunt capacitance unit 650' further includes an avalanche diode 696 that is positioned between the power supply conductor 632 and the return conductor 633 of the jumper cable, in parallel to the capacitors 690, 692. The diode 696 is designed to be non-conducting under normal operating conditions, but to start conducting at higher reverse bias voltages. For instance, in one example embodiments the diode 696 may be designed to be non-conducting at reverse bias voltages that are at somewhere between 0.5 Volts and 3 Volts less than the maximum specified voltage for the power supply signal that is provided to the remote radio head, but to start conducting at higher reverse bias voltages. It will be appreciated, however, that the avalanche diode 696 may be designed to operate at other voltage margins in other embodiments. The reverse breakdown voltage of the avalanche diode 696 may be selected based on a maximum specified voltage for the power supply signal that is provided to the remote radio head. Thus, if the voltage of the DC power signal at the input to the remote radio head starts to approach the maximum specified power signal voltage for the remote radio head, the avalanche diode 696 experiences reverse breakdown and will provide a bypass current path.

In the embodiment of FIG. 13, the diode 696 may be more effective than the capacitors 690, 692 in absorbing voltage spikes to ensure that the voltage of the power supply signal does not exceed the maximum specified power signal voltage for the remote radio head. If the voltage of the power signal spikes above the reverse breakdown voltage of the avalanche diode 696, the voltage across the diode 696 will be held substantially at the reverse breakdown voltage for the duration of the voltage spike (i.e., until the programmable power supply regulates the voltage). In some embodiments of FIG. 13, the shunt capacitors 690, 692 and/or the fuse circuit 694 may be omitted so that the circuit 650' will simply be a protection circuit without any shunt capacitance.

A diode such as, for example, the avalanche diode 696 that is included in the embodiment of FIG. 13, may also be used to measure the resistance of the power cabling connection according to further embodiments of the present invention. In particular, a reverse DC voltage may be applied across the power supply and return conductors 632, 633, and the reverse current in response to this reverse voltage may be measured using, for example, the resistance measurement circuit 170 of the programmable power supply (see FIG. 5). The reverse voltage across the input to the remote radio head will be limited to the forward voltage across the avalanche diode 696, which will be less than 1 Volt, and hence will not be harmful to the remote radio head. While this measurement cannot be done during normal operation of the remote radio head (as the reverse DC voltage is applied as opposed to the normal power supply signal), this technique may be performed, for example, as part of the qualification of a new cellular base station to measure the resistance of the power cabling connection thereof. It will be appreciated that other types of diodes such as a p-n diode or a Schottky diode may be used in place of the avalanche diode 696 for purposes of making such a resistance measurement. The use of the avalanche diode 696 additionally provides the above-described over-voltage protection feature.

Figure 14:
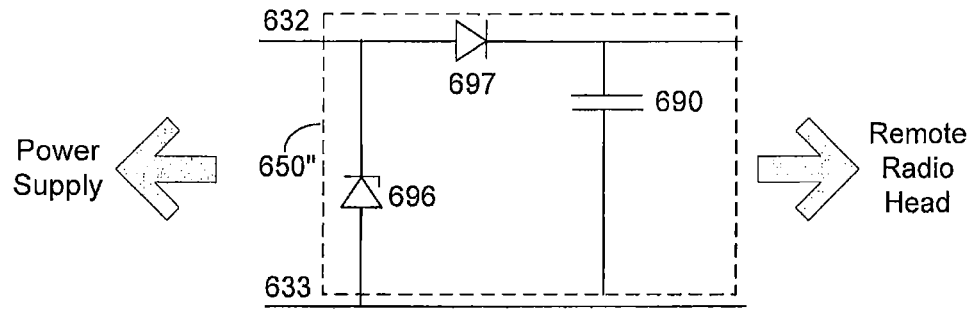
FIG. 14 is a circuit diagram of a shunt capacitance unit that includes an avalanche diode according to further embodiments of the present invention.

Moreover, as shown in FIG. 14, in a further embodiment, a diode 697 may be added in series along the power supply conductor 632 in between the shunt paths for the avalanche diode 696 and the capacitor 690. Alternatively, diode 697 may be reversed and placed in the corresponding location along return conductor 633. The capacitor 690 may hold the voltage to the remote radio head for the very short time period necessary to measure the reverse current when the reverse voltage is applied as discussed above. The diode 697 may prevent the capacitor 690 from discharging through resistance measuring circuit during periods when the reverse voltage is applied. Thus, the circuit 650" of FIG. 14 may be used to measure the resistance of the power cabling connection during normal operation of the remote radio head by quickly applying the reverse voltage and measuring the reverse current during normal operation. In other embodiments the circuit of FIG. 14 may further include the fuse circuit 694 and/or the second capacitor 692 that are shown in FIG. 13.

Figure 15:
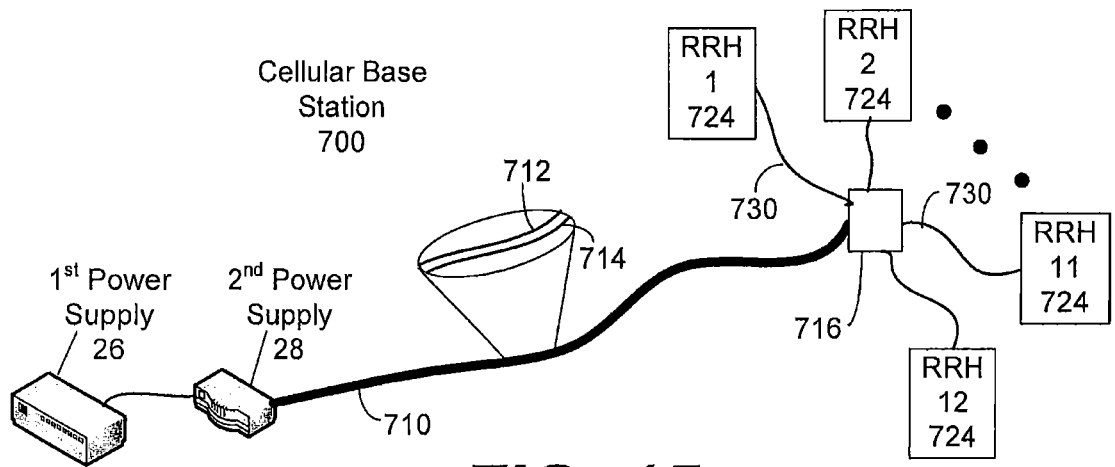
FIG. 15 is a schematic diagram of a cellular base station according to still further embodiments of the present invention.

FIG. 15 is a schematic block diagram illustrating selected elements of a cellular base 700 according to further embodiments of the present invention. The cellular base station 700 uses a so-called "power bus" power cable 710 that has a single power supply conductor 712 and a single return conductor 714. These conductors 712, 714 are typically much larger than the conductors provided in a power cable that includes a separate pair of power supply and return conductors for each remote radio head. The pair of conductors 712, 714 are used to provide power signals to a plurality of remote radio heads 724. The power bus cable 710 includes a junction enclosure 716, and individual power jumper cables 730 may be used to connect each remote radio head 724 to the power supply and return conductors 712, 714 of the power bus cable 710. The power bus cable 710 may be a standalone power cable or may be part of a trunk cable that also includes optical fibers that carry data between the remote radio heads 724 and baseband units (not shown).

The use of power bus power cables such as cable 710 in the cellular base stations according to embodiments of the present invention may have certain advantages. In particular, the current drawn over the power bus cable 710 will be the current required by all of the remote radio heads 724 that are powered over the power bus cable 710. As state-of-the-art cellular base stations now often have twelve (or more) remote radio heads 724, the current drawn over the pair of conductors 712, 714 will be the total current drawn by all twelve remote radio heads 724. Thus, large changes in the current drawn by one of the remote radio heads that would normally require a large adjustment in the output voltage of the power supply signal are smoothed out since any one remote radio head 724 will only be drawing, on average, one twelfth of the current carried over the power bus cable 710.

While embodiments of the present invention are primarily described above with respect to cellular base stations that have conventional antenna towers, it will be appreciated that the techniques and systems described herein may be applied to a wide variety of other cellular systems. For example, cellular service is often provided in tunnels by locating the baseband equipment and power supply in an enclosure and then connecting this equipment to remote radio heads and antennas via long horizontal trunk cables. Very long cabling connections may be used in some instances, and the voltage drop along the cable may be particularly problematic in such installations. Similarly, in some metrocell architectures, the same concept is applied above-ground, with the remote radio heads and antennas typically mounted on smaller, pre-existing structures such as utility poles, buildings and the like. Once again, the trunk cables connecting the baseband equipment and power supplies to the distributed remote radio heads and antennas may be very long (e.g., a kilometre or more in some cases), and hence voltage drop likewise may be a significant problem. Any of the above-described embodiments of the present invention may be used in these or similar applications.

The present invention has been described with reference to the accompanying drawings, in which certain embodiments of the invention are shown. This invention may, however, be embodied in many different forms and should not be construed as limited to the embodiments that are pictured and described herein; rather, these embodiments are provided so that this disclosure will be thorough and complete, and will fully convey the scope of the invention to those skilled in the art. Like numbers refer to like elements throughout the specification and drawings. It will also be appreciated that the embodiments disclosed above can be combined in any way and/or combination to provide many additional embodiments.

It will be understood that, although the terms first, second, etc. are used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

Unless otherwise defined, all technical and scientific terms that are used in this disclosure have the same meaning as commonly understood by one of ordinary skill in the art to which this invention belongs. The terminology used in the above description is for the purpose of describing particular embodiments only and is not intended to be limiting of the invention. As used in this disclosure, the singular forms "a", "an" and "the" are intended to include the plural forms as well, unless the context clearly indicates otherwise. It will also be understood that when an element (e.g., a device, circuit, etc.) is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the description above, when multiple units of an element are included in an embodiment, each individual unit may be referred to individually by the reference numeral for the element followed by a dash and the number for the individual unit (e.g., antenna 32-2), while multiple units of the element may be referred to collectively by their base reference numeral (e.g., the antennas 32).

It will be further understood that the terms "comprises" "comprising," "includes" and/or "including" when used herein, specify the presence of stated features, operations, elements, and/or components, but do not preclude the presence or addition of one or more other features, operations, elements, components, and/or groups thereof.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of powering a radio, the method comprising:
    obtaining a resistance of power conductors between a power supply and the radio;
    outputting a direct current (DC) power signal from the power supply and supplying the DC power signal that is output from the power supply to the radio over the power conductors;
    measuring a current level of the DC power signal; and
    automatically adjusting a voltage level of the DC power signal in response to changes in the measured current level of the DC power signal, wherein the voltage level of the DC power signal that is output from the power supply is adjusted so that a voltage, of the DC power signal at radio ends of the power conductors adjacent the radio, is maintained within a predetermined margin and below a maximum voltage of the radio notwithstanding variation in the current level of the DC power signal that is output from the power supply.

2. The method of claim 1, wherein obtaining the resistance of the power conductors comprises receiving a feedback signal from a voltage sensor located at the radio ends of the power conductors.

3. The method of claim 2, wherein the feedback signal comprises a voltage level that is measured at the radio ends of the power conductors.

4. The method of claim 1, wherein obtaining the resistance of the power conductors comprises transmitting at least two alternating current (AC) power signals having different frequencies over the power conductors and measuring an amplitude and phase shift of each of the at least two AC power signals at the radio ends of the power conductors.

5. The method of claim 1, wherein obtaining the resistance of the power conductors comprises transmitting at least two DC power signals having different voltages over the power conductors and measuring a current of each of the at least two DC power signals at the power supply.

6. The method of claim 1, wherein obtaining the resistance of the power conductors comprises measuring an impedance of the power conductors.

7. The method of claim 1, wherein the predetermined margin is a substantially constant voltage.

8. The method of claim 1, wherein the resistance is determined at periodic intervals.

9. A power system comprising:
    a power supply configured to automatically adjust a voltage level of a direct current (DC) power signal output by the power supply in response to changes in a measured current level of the DC power signal, wherein the voltage level of the DC power signal that is output from the power supply is adjusted so that a voltage, of the DC power signal at radio ends of power conductors between the power supply and a radio, is maintained within a predetermined margin and below a maximum input voltage of the radio notwithstanding variation in the measured current level of the DC power signal that is output from the power supply.

10. The power system of claim 9, further comprising a shunt capacitance unit provided between first and second conductors of the power conductors and configured to dampen increases in voltage that result from changes in current drawn by the radio.

11. The power system of claim 10, wherein the shunt capacitance unit comprises two or more capacitors coupled in series between the first and second conductors of the power conductors.

12. The power system of claim 10, wherein the shunt capacitance unit provided between the first and second conductors of the power conductors is configured to dampen increases in voltage where a dampened, increased voltage does not exceed the maximum input voltage of the radio.

13. The power system of claim 10, wherein the power conductors comprise a trunk cable and a jumper cable, and wherein the shunt capacitance unit is provided in the jumper cable.

14. The power system of claim 9, wherein the power supply further comprises a resistance measurement circuit configured to determine a resistance of the power conductors.

15. The power system of claim 14, wherein the resistance measurement circuit is configured to determine the resistance of the power conductors based on current measurements of at least two DC power signals having different voltages transmitted over the power conductors.

16. The power system of claim 15, wherein the resistance measurement circuit is configured to determine the resistance of the power conductors based on a measured impedance of the power conductors.

17. A power system comprising:
    a power supply configured to automatically adjust a voltage level of a direct current (DC) power signal output by the power supply in response to changes in a measured current level of the DC power signal, wherein the voltage level of the DC power signal that is output from the power supply is adjusted so that a voltage, of the DC power signal at a radio ends of power conductors between the power supply and a radio, is maintained within a predetermined margin and below a maximum input voltage of the radio notwithstanding variation in the measured current level of the DC power signal that is output from the power supply; and
    a voltage sensor located at the radio ends of the power conductors and configured to provide a feedback signal to the power supply.

18. The power system of claim 17, wherein the feedback signal comprises a voltage that is measured at the radio ends of the power conductors.

19. The power system of claim 17, wherein the predetermined margin is a substantially constant voltage.

20. The power system of claim 17, further comprising a shunt capacitance unit provided between first and second conductors of the power conductors and configured to dampen increases in voltage that result from changes in current drawn by the radio.

21. The method of claim 1, wherein a voltage level at the radio ends of the power conductors exceeds a nominal DC voltage level of the radio.

22. The method of claim 21, wherein the voltage level at the radio ends of the power conductors is within four volts of a maximum DC voltage level of the radio.

23. The power system of claim 9, wherein the voltage at the radio ends of the power conductors exceeds a nominal DC voltage level of the radio.

24. The power system of claim 23, wherein the voltage at the radio ends of the power conductors is within four volts of a maximum DC voltage level of the radio.

25. The power system of claim 17, wherein the voltage at the radio ends of the power conductors exceeds a nominal DC voltage level of the radio.

26. The power system of claim 25, wherein the voltage at the radio ends is within four volts of a maximum DC voltage level of the radio.

\* \* \* \* \*

UNITED STATES PATENT AND TRADEMARK OFFICE
CERTIFICATE OF CORRECTION

Page 1 of 1

PATENT NO. : 11,294,409 B2
APPLICATION NO. : 16/403773
DATED : April 5, 2022
INVENTOR(S) : Chamberlain et al.

It is certified that error appears in the above-identified patent and that said Letters Patent is hereby corrected as shown below:

On the Title Page

At the end of Page 5 Other Publications please add:
--U.S. PATENT AND TRADEMARK OFFICE, "Office Action", Application No. 16/931,734, 12/21/2021, Page(s) 1 through 134, Published: US
U.S. PATENT AND TRADEMARK OFFICE, "Office Action", Application No. 16/931,734, 12/22/2021, Page(s) 1 through 142, Published: US
U.S. PATENT AND TRADEMARK OFFICE, "Office Action", Application No. 16/994,809, 12/21/2021, Page(s) 1 through 36, Published: US-- After "Published: AU."

Signed and Sealed this
Eighth Day of October, 2024

Katherine Kelly Vidal
*Director of the United States Patent and Trademark Office*